United States Patent
Zhang et al.

(10) Patent No.: US 9,399,730 B2
(45) Date of Patent: Jul. 26, 2016

(54) WAVELENGTH CONVERSION MATERIAL AS ENCAPSULATE FOR SOLAR MODULE SYSTEMS TO ENHANCE SOLAR HARVESTING EFFICIENCY

(71) Applicant: NITTO DENKO CORPORATION, Osaka (JP)

(72) Inventors: Hongxi Zhang, Temecula, CA (US); Stanislaw Rachwal, Oceanside, CA (US); Jie Cai, Simi Valley, CA (US); Yufen Hu, San Diego, CA (US); Michiharu Yamamoto, Santa Clara, CA (US); Zongcheng Jiang, Oceanside, CA (US); Bogumila Rachwal, Oceanside, CA (US); Shuangxi Wang, Corona, CA (US); Peng Wang, San Diego, CA (US)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/631,710

(22) Filed: Sep. 28, 2012

(65) Prior Publication Data
US 2013/0139868 A1    Jun. 6, 2013

Related U.S. Application Data

(60) Provisional application No. 61/567,548, filed on Dec. 6, 2011, provisional application No. 61/662,848, filed on Jun. 21, 2012.

(51) Int. Cl.
*H01L 31/055* (2014.01)
*H01L 31/18* (2006.01)
(Continued)

(52) U.S. Cl.
CPC ............ *C09K 11/06* (2013.01); *H01L 31/0481* (2013.01); *H01L 31/055* (2013.01);
(Continued)

(58) Field of Classification Search
USPC .............. 136/247, 251; 438/64; 257/E31.118
See application file for complete search history.

(56) References Cited

U.S. PATENT DOCUMENTS

| | | |
|---|---|---|
| 3,239,406 A | 3/1966 | Coffman et al. |
| 4,162,928 A | 7/1979 | Shepard, Jr. |

(Continued)

FOREIGN PATENT DOCUMENTS

| | | |
|---|---|---|
| CN | 1 671 675 | 9/2005 |
| CN | 101 148 495 | 3/2008 |

(Continued)

OTHER PUBLICATIONS

Hasobe et al., "Hierarchical Assembly of Porphyrins and Fullerenes for Solar Cells," Interface, Summer 2006, pp. 47-51.*

(Continued)

*Primary Examiner* — Ling Choi
*Assistant Examiner* — Catherine S Branch
(74) *Attorney, Agent, or Firm* — Vedder Price P.C.

(57) ABSTRACT

This invention relates to an encapsulation structure comprising a luminescent wavelength conversion material for at least one solar cell or photovoltaic device which acts to enhance the solar harvesting efficiency of the solar cell device. The luminescent wavelength conversion material comprises at least one chromophore and an optically transparent polymer matrix. Application of the encapsulation structure, as disclosed herein, to solar harvesting devices, including solar cells, solar panels, and photovoltaic devices, improves the solar harvesting efficiency of the device by widening the spectrum of incoming sunlight that can be effectively converted into electricity by the device.

27 Claims, 5 Drawing Sheets

(51) Int. Cl.
*H01L 31/048* (2014.01)
*C09K 11/06* (2006.01)

(52) U.S. Cl.
CPC . *C09K2211/1007* (2013.01); *C09K 2211/1011* (2013.01); *C09K 2211/1029* (2013.01); *C09K 2211/1059* (2013.01); *Y02E 10/52* (2013.01)

(56) References Cited

U.S. PATENT DOCUMENTS

| | | | |
|---|---|---|---|
| 4,618,694 | A | 10/1986 | Iden et al. |
| 5,710,197 | A | 1/1998 | Fischer et al. |
| 5,816,238 | A | 10/1998 | Burns et al. |
| 6,924,427 | B2 * | 8/2005 | Eckert et al. ............ 136/252 |
| 7,714,099 | B2 * | 5/2010 | Morishita et al. .......... 528/423 |
| 7,791,157 | B2 | 9/2010 | Cho et al. |
| 7,943,845 | B2 | 5/2011 | Hayes |
| 7,976,750 | B2 | 7/2011 | Burmeister et al. |
| 8,158,450 | B1 * | 4/2012 | Sheats et al. ................ 438/57 |
| 2004/0115473 | A1 | 6/2004 | Burroughes et al. |
| 2005/0271566 | A1 | 12/2005 | Yadav |
| 2006/0083945 | A1 | 4/2006 | Morishita et al. |
| 2007/0003783 | A1 | 1/2007 | Morishita et al. |
| 2007/0029538 | A1 | 2/2007 | Pinnow |
| 2007/0073052 | A1 | 3/2007 | Velusamy et al. |
| 2008/0149165 | A1 | 6/2008 | Hoeks et al. |
| 2008/0236667 | A1 | 10/2008 | Naum et al. |
| 2008/0245411 | A1 | 10/2008 | Hammermann et al. |
| 2008/0289681 | A1 | 11/2008 | Adriani et al. |
| 2009/0151785 | A1 | 6/2009 | Naum et al. |
| 2009/0211631 | A1 | 8/2009 | Temchenko et al. |
| 2009/0290211 | A1 | 11/2009 | Miteva et al. |
| 2010/0012183 | A1 | 1/2010 | Yeh |
| 2010/0043875 | A1 | 2/2010 | Bhaumik et al. |
| 2010/0043880 | A1 | 2/2010 | Bhaumik et al. |
| 2010/0139769 | A1 | 6/2010 | Mapel |
| 2010/0154862 | A1 | 6/2010 | Schiavoni et al. |
| 2010/0186801 | A1 | 7/2010 | Boehm et al. |
| 2010/0249367 | A1 | 9/2010 | Toppare et al. |
| 2010/0294339 | A1 | 11/2010 | Hollars |
| 2011/0011455 | A1 | 1/2011 | Ji et al. |
| 2011/0017268 | A1 | 1/2011 | Shembel et al. |
| 2011/0204292 | A1 | 8/2011 | Imamura |
| 2011/0253197 | A1 | 10/2011 | Mapel et al. |
| 2012/0222723 | A1 | 9/2012 | Mayer et al. |
| 2012/0227809 | A1 | 9/2012 | Bharti et al. |
| 2013/0074927 | A1 | 3/2013 | Rachwal et al. |
| 2013/0089946 | A1 * | 4/2013 | Zhang et al. ................ 438/86 |
| 2013/0284265 | A1 | 10/2013 | Jiang et al. |
| 2014/0083482 | A1 | 3/2014 | Hebrink |
| 2014/0311566 | A1 | 10/2014 | Zhang et al. |

FOREIGN PATENT DOCUMENTS

| | | |
|---|---|---|
| CN | 101 289 447 | 10/2008 |
| CN | 101 343 352 | 1/2009 |
| CN | 101 671 428 | 3/2010 |
| CN | 101 775 123 | 7/2010 |
| CN | 101 935 389 | 1/2011 |
| CN | 102 115 643 | 7/2011 |
| CN | 102 464 794 | 5/2012 |
| DE | 28 51 513 | 6/1980 |
| DE | 34 00 991 | 7/1985 |
| DE | 10 2005 062 687 | 7/2007 |
| EP | 0 692 517 | 1/1996 |
| EP | 2 080 785 | 7/2009 |
| EP | 2 194 106 | 6/2010 |
| EP | 2 261 300 | 12/2010 |
| EP | 2 333 017 | 6/2011 |
| EP | 2 354 204 | 8/2011 |
| EP | 2 355 162 | 8/2011 |
| EP | 2 557 137 | 2/2013 |
| EP | 2 557 606 | 2/2013 |
| EP | 2 578 075 | 4/2013 |
| JP | 11-220147 | 8/1999 |
| JP | 2001-094129 | 4/2001 |
| JP | 2006-077171 | 3/2006 |
| JP | 2008-516008 | 5/2008 |
| JP | 2010-283282 | 12/2010 |
| JP | 2011-151094 | 8/2011 |
| WO | WO 02/022761 | 3/2002 |
| WO | WO 2004/092246 | 10/2004 |
| WO | WO 2005/054212 | 6/2005 |
| WO | WO 2006/041221 | 4/2006 |
| WO | WO 2006/088369 | 8/2006 |
| WO | WO 2008/110567 | 9/2008 |
| WO | WO 2009/011791 | 1/2009 |
| WO | WO 2009/115574 | 9/2009 |
| WO | WO 2010/046114 | 4/2010 |
| WO | WO 2010/114497 | 10/2010 |
| WO | WO 2011/068305 | 6/2011 |
| WO | WO 2011/072876 | 6/2011 |
| WO | WO 2012/024070 | 2/2012 |
| WO | WO 2012/068703 | 5/2012 |
| WO | WO 2012/134992 | 10/2012 |
| WO | WO 2013/052381 | 4/2013 |
| WO | WO 2013/085607 | 6/2013 |
| WO | WO 2013/116559 | 8/2013 |
| WO | WO 2013/116569 | 8/2013 |
| WO | WO 2014/160707 | 10/2014 |

OTHER PUBLICATIONS

Tedlar Product and Performance Guide (Dec. 1995).*
Klampaftis et al., "Enhancing the performance of solar cells via luminescent down-shifting of the incident spectrum: A review," Sol. Energy Mater. Sol. Cells, 93 (2009) 1182-1194.*
U.S. Appl. No. 61/430,053, filed Jan. 5, 2011, Nitto Denko Corp.
U.S. Appl. No. 61/485,093, filed May 11, 2011, Wang et al.
U.S. Appl. No. 61/539,392, filed Sep. 26, 2011, Rachwal et al.
Balan et al., "Electrochromic Device and Bulk Heterojunction Solar Cell Applications of Poly 4,7-bis(2,3-dihydrothieno[3,4-b][1,4]dioxin-5-yl)-2-dodecyl-2H-benzo[1,2,3]triazole (PBEBT)", Solar Energy Materials & Solar Cells, 2010, vol. 94, pp. 1797-1802.
Balan et al., "One Polymer for All: Benzotriazole Containing Donor-Acceptor Type Polymer as a Multi-Purpose Material", Chemical Communications, 2009, vol. 44, pp. 6768-6770.
Baran et al., "Processable Multipurpose Conjugated Polymer for Electrochromic and Photovoltaic Applications", Chemistry of Materials, 2010, vol. 22, pp. 2978-2987.
Baran et al., "Spectroelectrochemical and Photovoltaic Characterization of a Solution-Processable n-and-p Type Dopable Pyrrole-Bearing Conjugated Polymer", Macromolecular Chemistry and Physics, 2010, vol. 211, No. 24, pp. 2602-2610.
Bulut et al., "Benzotriazole Derivatives as Long Wavelength Photosensitizers for Diaryliodonium Salt Initiators", Journal of Polymer Science Part A: Polymer Chemistry, 2010, vol. 49, No. 3, pp. 729-733.
Cui et al., "Incorporating Benzotriazole Moiety to Construct D-A-Π-A Organic Sensitizers for Solar Cells: Significant Enhancement of Open-Circuit Photovoltage with Long Alkyl Group", Chemistry of Materials, 2011, vol. 23, No. 19, pp. 4394-4401.
Falzon et al., "Designing Acceptor Polymers for Organic Photovoltaic Devices", The Journal of Physical Chemistry, 2011, vol. 115, No. 7, pp. 3178-3187.
Lin et al., "High Photoelectric Conversion Efficiency of Metal Phthalocyanine/Fullerene Heterojunction Photovoltaic Device", International Journal of Molecular Sciences, 2011, vol. 12, pp. 476-505.
Liu et al., "A Dithienyl Benzotriazole-based Polyfluorene:Synthesis and Applications in Polymer Solar Cells and Red Light-Emitting Diodes", Macromolecular Chemistry and Physics, 2011, vol. 212, No. 14, pp. 1489-1496.
Min et al., "Synthesis and Photovoltaic Properties of D-A Copolymers Based on Dithienosilole and Benzotriazole", Macromolecules, 2011, vol. 44, No. 19, pp. 7632-7638.
Peng et al., "A New Dithienylbenzotriazole-Based Poly(2,7-carbazole) for Efficient Photovoltaics", Macromolecular Chemistry and Physics, 2010, vol. 211, No. 18, pp. 2026-2033.

(56) References Cited

OTHER PUBLICATIONS

Price et al., "Fluorine Substituted Conjugated Polymer of Medium Band Gap Yields 7% Efficiency in Polymer-Fullerene Solar Cells", Journal of the American Chemical Society, 2011, vol. 133, No. 12, pp. 4625-4631.

Xu et al., "Conjugated Polymers for Optoelectronic Applications", Macromolecular Symposia, 2008, pp. 161-170.

Zhang et al., "Bulk-Heterojunction Solar Cells with Benzotriazole-Based Copolymers as Electron Donors: Largely Improved Photovoltaic Parameters by Using PFN/A1 Bilayer Cathode", Macromolecules, 2010, vol. 43, pp. 9771-9778.

Zhang et al., "Copolymers from Benzodithiphene and Benzotriazole: Synthesis and Photovoltaic Applications", Polymer Chemistry, 2010, vol. 1, No. 9, pp. 1441-1447.

Zhang et al., "Synthesis and Photovoltaic Properties of Dithienyl Benzotriazole Based Poly(phenylene vinylene)s", Journal of Applied Polymer Science, 2011, vol. 120, pp. 2534-2542.

Invitation to Pay Additional Fees in PCT Application No. PCT/US2012/058070 dated Jan. 30, 2013.

Pasker et al., "Thiophene-2-aryl-2*H*-benzotriazole-thiophene Oligomers with Adjustable Electronic Properties," Organic Letters, 2011, vol. 13, No. 9, pp. 2338-2341.

International Search Report and Written Opinion in PCT Application No. PCT/US2012/058070 dated Apr. 4, 2013.

International Preliminary Report on Patentability and Written Opinion in PCT Application No. PCT/US2012/058070 dated Jun. 19, 2014.

"DuPont™ Teflon® Films for Photovoltaic Modules" Dec. 2006, pp. 3.

Krebs, et al., "Product Integration of Compact Roll-to-Roll Processed Polymer Solar Cell Modules: Methods and Manufacture Using Flexographic Printing, Slot-die Coating and Rotary Screen Printing," Journal of Materials Chemistry, 2010, vol. 20, pp. 8994-9001.

Mao et al., "Benzotriazole-Bridged Sensitizers Containing a Furan Moiety for Dye-Sensitized Solar Cells with High Open-Circuit Voltage Performance," Chemistry Asian Journal, 2012, pp. 982-991.

Pasker et al., "Photovoltaic Response to Structural Modifications on a Series of Conjugated Polymers Based on 2-Aryl-2*H*-Benzotriazoles," Polymer Chemistry, 2011, vol. 49, No. 23, pp. 5001-5011.

Singh-Rachford et al., "Photon Upconversion Based on Sensitized Triplet-Triplet Annihilation," Coordination Chemistry Reviews, 2010, vol. 254, pp. 2560-2573.

Yuan et al., "Efficient Synthesis of Regioisomerically Pure Bis(trufluoromethyl)-Substituted 3,4,9,10-Perylene Tetacarboxylic Bis(Benzimidazole)", Organic Letters, 2009, vol. 11, No. 13, pp. 2808-2811.

Zhu et al., "Organic D-A-Π-A Solar Cell Sensitizers with Improved Stability and Spectral Response", Advanced Functional Materials, 2011, vol. 21, pp. 756-763.

\* cited by examiner

US 9,399,730 B2

WAVELENGTH CONVERSION MATERIAL AS ENCAPSULATE FOR SOLAR MODULE SYSTEMS TO ENHANCE SOLAR HARVESTING EFFICIENCY

CROSS-REFERENCE TO RELATED APPLICATIONS

This patent application claims the benefit of priority to U.S. Provisional Patent Application No. 61/567,548, filed Dec. 6, 2011, and U.S. Provisional Patent Application No. 61/662, 848, filed Jun. 21, 2012. All of the foregoing applications are fully incorporated herein by reference for all purposes.

BACKGROUND OF THE INVENTION

1. Field of the Invention

Embodiments of present invention generally relate to an encapsulation structure comprising a luminescent wavelength conversion material for solar cells, solar panels, or photovoltaic devices, which enhances the solar harvesting efficiency of these devices.

2. Description of the Related Art

The utilization of solar energy offers a promising alternative energy source to the traditional fossil fuels, and therefore, the development of devices that can convert solar energy into electricity, such as photovoltaic devices (also known as solar cells), has drawn significant attention in recent years. Several different types of mature photovoltaic devices have been developed, including a Silicon based device, a III-V and II-VI PN junction device, a Copper-Indium-Gallium-Selenium (CIGS) thin film device, an organic sensitizer device, an organic thin film device, and a Cadmium Sulfide/Cadmium Telluride (CdS/CdTe) thin film device, to name a few. More detail on these devices can be found in the literature, such as Lin et al., "High Photoelectric Conversion Efficiency of Metal Phthalocyanine/Fullerene Heterojunction Photovoltaic Device" (International Journal of Molecular Sciences 2011). However, the photoelectric conversion efficiency of many of these devices still has room for improvement and development of techniques to improve this efficiency has been an ongoing challenge for many researchers.

Recently, one technique developed to improve the efficiency of photovoltaic devices is to utilize a wavelength down-shifting film Many of the photovoltaic devices are unable to effectively utilize the entire spectrum of light as the materials on the device absorb certain wavelengths of light (typically the shorter UV wavelengths) instead of allowing the light to pass through to the photoconductive material layer where it is converted into electricity. Application of a wavelength down-shifting film absorbs the shorter wavelength photons and re-emits them at more favorable longer wavelengths, which can then be absorbed by the photoconductive layer in the device, and converted into electricity.

This phenomenon is often observed in the thin film CdS/CdTe and CIGS solar cells which both use CdS as the window layer. The low cost and high efficiency of these thin film solar cells has drawn significant attention in recent years, with typical commercial cells having photoelectric conversion efficiencies of 10-16%. However, one issue with these devices is the energy gap of CdS, approximately 2.41 eV, which causes light at wavelengths below 514 nm to be absorbed by CdS instead of passing through to the photoconductive layer where it can be converted into energy. This inability to utilize the entire spectrum of light effectively reduces the overall photoelectric conversion efficiency of the device.

There have been numerous reports disclosing the utilization of a wavelength down-shifting material to improve the performance of photovoltaic devices. For example, U.S. Patent Application Publication No. 2009/0151785 discloses a silicon based solar cell which contains a wavelength down-shifting inorganic phosphor material. U.S. Patent Application Publication No. US 2011/0011455 discloses an integrated solar cell comprising a plasmonic layer, a wavelength conversion layer, and a photovoltaic layer. U.S. Pat. No. 7,791,157 discloses a solar cell with a wavelength conversion layer containing a quantum dot compound. U.S. Patent Application Publication No. 2010/0294339 discloses an integrated photovoltaic device containing a luminescent down-shifting material, however no example embodiments were constructed. U.S. Patent Application Publication No. 2010/0012183 discloses a thin film solar cell with a wavelength down-shifting photo-luminescent medium; however, no examples are provided. U.S. Patent Application Publication No. 2008/0236667 discloses an enhanced spectrum conversion film made in the form of a thin film polymer comprising an inorganic fluorescent powder. However, each of these patents and patent application publications, which are incorporated herein by reference in their entirety, apply this additional wavelength conversion layer directly on top of or into the solar cell device, which adds additional cost to manufacturing the devices, and also increases the device thickness which can lead to an increase in the loss of photons to the environment out of the side surfaces.

Furthermore, solar modules are traditionally mounted outdoors on rooftops or in wide-open spaces where they can maximize their exposure to sunlight, see U.S. Patent Application Publication No. 2007/0295388, which is hereby incorporated by reference in its entirety. This type of outdoor placement subjects these devices to constant weather and moisture exposure, and therefore, they must have sufficient protection to provide many years of stable operation. Traditionally, solar cell modules have been weatherproofed by using glass sheets, which is expensive, heavy, and rigid, and also requires some type of edge tape to prevent moisture from penetrating the sides. U.S. Pat. No. 7,976,750 discloses a method of encapsulating solar modules by embedding them between two polymer layers and then filling in the gaps with a foaming agent. U.S. Patent Application Publication No. 2011/0017268 discloses a nanostructured polymer material for encapsulating solar module devices. U.S. Pat. No. 7,943,845 discloses a method of encapsulating solar modules using a poly(vinyl butyral) composition. However, none of these patents and patent application publications, which are incorporated herein by reference in their entirety, attempt to simultaneously provide environmental protection for the solar devices as well as enhanced solar harvesting efficiency.

SUMMARY OF THE INVENTION

Some embodiments of the present invention provide an encapsulation structure for a solar energy conversion device. Some embodiments of the present invention provide an encapsulation comprising a luminescent wavelength conversion material. In some embodiments, the luminescent wavelength conversion material comprises at least one chromophore and an optically transparent polymer matrix, wherein the luminescent wavelength conversion material is configured to encapsulate the solar energy conversion device and inhibit penetration of moisture and oxygen into the solar energy conversion device.

In some embodiments, the encapsulation structure comprises a luminescent wavelength conversion material and an environmental protective cover configured to inhibit penetration of moisture and oxygen into the luminescent wavelength conversion material. In some embodiments, the luminescent wavelength conversion material comprises at least one chromophore and an optically transparent polymer matrix. In some embodiments, the luminescent wavelength conversion material and the environmental protective cover are configured to encapsulate the solar energy conversion device such that light must pass through the luminescent wavelength conversion material and the environmental protective cover prior to reaching the solar energy conversion device.

Some embodiments of the present invention provide a method of improving the performance of a solar energy conversion device comprising encapsulating the device with the encapsulation structure. In some embodiments, the method involves using an encapsulation structure comprising a luminescent wavelength conversion material configured to encapsulate the solar energy conversion device and configured to inhibit penetration of moisture and oxygen into the solar energy conversion device. In some embodiments, the method involves using a luminescent wavelength conversion material and an environmental protective cover, wherein the environmental protective cover is configured to inhibit penetration of moisture and oxygen into the luminescent wavelength conversion material.

DETAILED DESCRIPTION

Embodiments of the present invention achieve both protection of cells from deleterious environmental exposure and improved efficiency in a two in one system. Encapsulation of solar module devices with the encapsulation structure comprising the luminescent wavelength conversion material, disclosed herein, enhances the solar harvesting efficiency of the solar cell device and provides stable long term environmental protection of the device. The encapsulation structure comprising the luminescent wavelength conversion material may be formed to be compatible with all different types of solar cells and solar panels, including Silicon based devices, III-V and II-VI PN junction devices, CIGS thin film devices, organic sensitizer devices, organic thin film devices, CdS/CdTe thin film devices, dye sensitized devices, etc. By employing the structure to encapsulate solar module devices, the photoelectric conversion efficiency of solar energy conversion devices (such as solar cells, photovoltaic devices, solar panels, and any solar module system) can be improved.

Some embodiments provide an encapsulation structure for at least one solar cell or photovoltaic device comprising a luminescent wavelength conversion material. Some embodiments provide an encapsulation structure for at least one solar cell or photovoltaic device comprising a luminescent wavelength conversion material and an environmental protective cover. In some embodiments, the environmental protective cover is configured to inhibit penetration of moisture and oxygen into the luminescent wavelength conversion material and the solar cell or photovoltaic device and comprises plastic or glass sheets. In some embodiments, a sealing tape is applied to the perimeter of the solar panel to inhibit the ingress of oxygen and moisture from the edges. Example embodiments of this encapsulate structure applied to a solar cell or photovoltaic module devices are illustrated in FIGS. 1-6.

Figure 7:
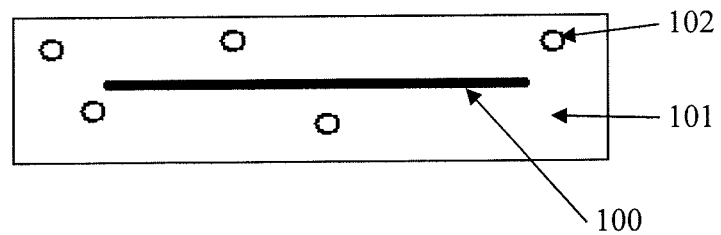
FIG. 7 illustrates an embodiment of an encapsulation structure where a single solar cell device is encapsulated in the luminescent wavelength conversion material, and the luminescent wavelength conversion material also acts as an environmental protector.
Figure 8:
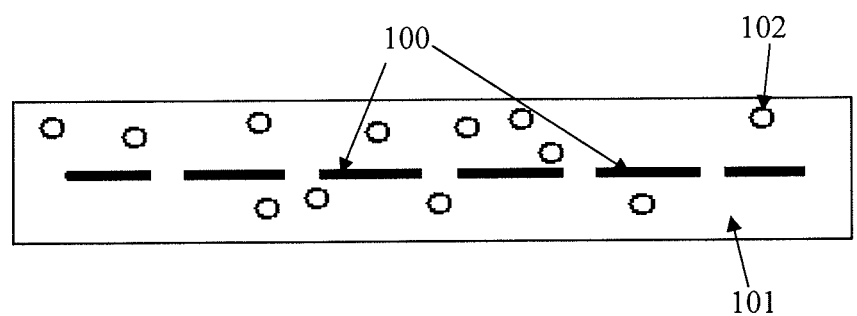
FIG. 8 illustrates an embodiment of an encapsulation structure where a plurality of solar cell devices are encapsulated in the luminescent wavelength conversion material, and the luminescent wavelength conversion material also acts as an environmental protector.
Figure 9:
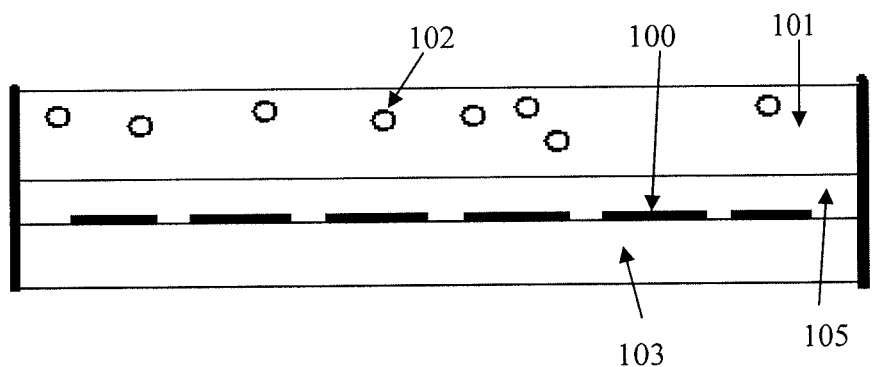
FIG. 9 illustrates an embodiment of an encapsulation structure where a plurality of solar cell devices are encapsulated in a pure polymer encapsulation material, the luminescent wavelength conversion material is laminated on top of the pure polymer encapsulate, and the luminescent wavelength conversion material also acts as an environmental protector.

Some embodiments of the invention provide an encapsulation structure for at least one solar cell or photovoltaic device comprising a luminescent wavelength conversion material. In some embodiments, the luminescent wavelength conversion material acts as an environmental protector to prevent moisture and oxygen penetration into the solar cell. In one embodiment, the luminescent wavelength conversion material is designed to prevent oxygen and moisture penetration into the solar cell, such that an additional environmental protection cover is not needed, and the material also enhances the solar harvesting efficiency of the cell. Example embodiments of this encapsulate structure applied to solar module devices are illustrated in FIGS. 7-9.

Embodiments of the present invention are also directed towards methods for improving the performance of photovoltaic devices, solar cells, solar modules, or solar panels, comprising encapsulating the device with the encapsulation structures disclosed herein. In some embodiments, the luminescent wavelength conversion material of the encapsulation structure may be cast onto the solar cell devices and cured in place. In some embodiments, the luminescent wavelength conversion material of the encapsulation structure may be in the form of film(s) or layer(s). In some embodiments, the luminescent wavelength conversion material, in the form of a thin film, may be roll laminated onto the solar module devices, wherein only a front layer is laminated onto the solar modules, or both a front and back layer are laminated onto the solar module devices.

Additional forms of the luminescent wavelength conversion material are also possible, as well as additional methods of applying the luminescent wavelength conversion material to the solar module devices. The encapsulation structure may be applied to rigid devices or it may be applied to flexible devices. Furthermore, the encapsulation structure can be used to improve the performance of multiple solar cells or photovoltaic devices. For example, in some embodiments, the encapsulation structure comprises a plurality of solar cells or photovoltaic devices.

Figure 10:
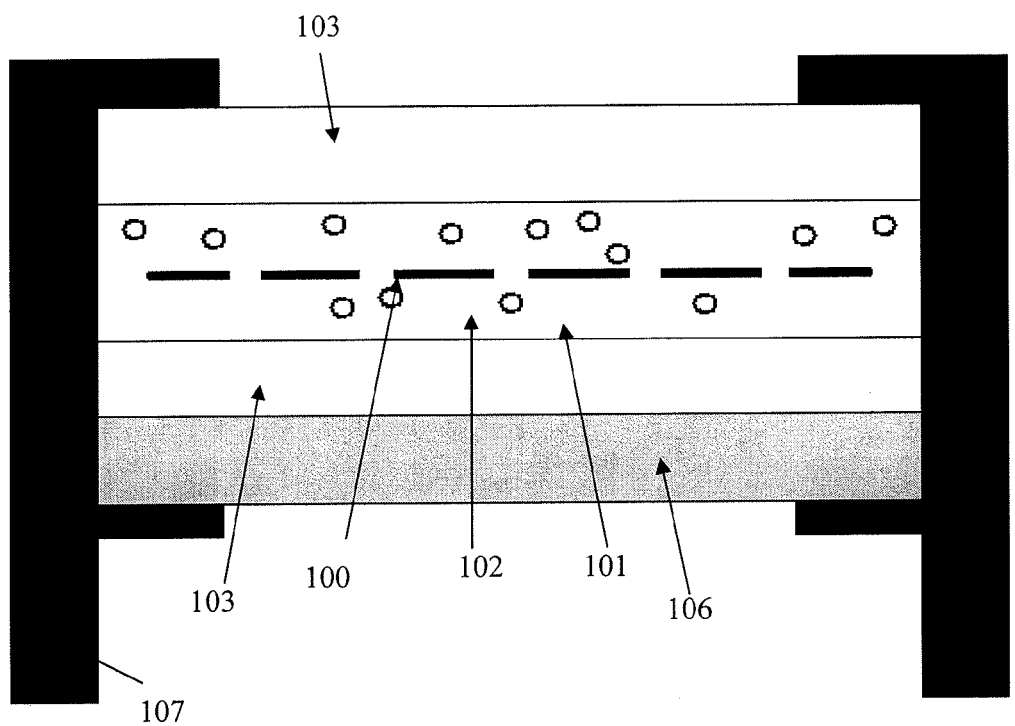
FIG. 10 illustrates an example embodiment of an encapsulation structure where a solar panel with several solar cell devices utilizes a luminescent wavelength conversion material to encapsulate the solar cell devices, a glass bottom sheet and a glass top sheet provide environmental protection, a back sheet is underneath the light incident surface of the solar cell devices, and a frame holds the panel together.
Figure 11:
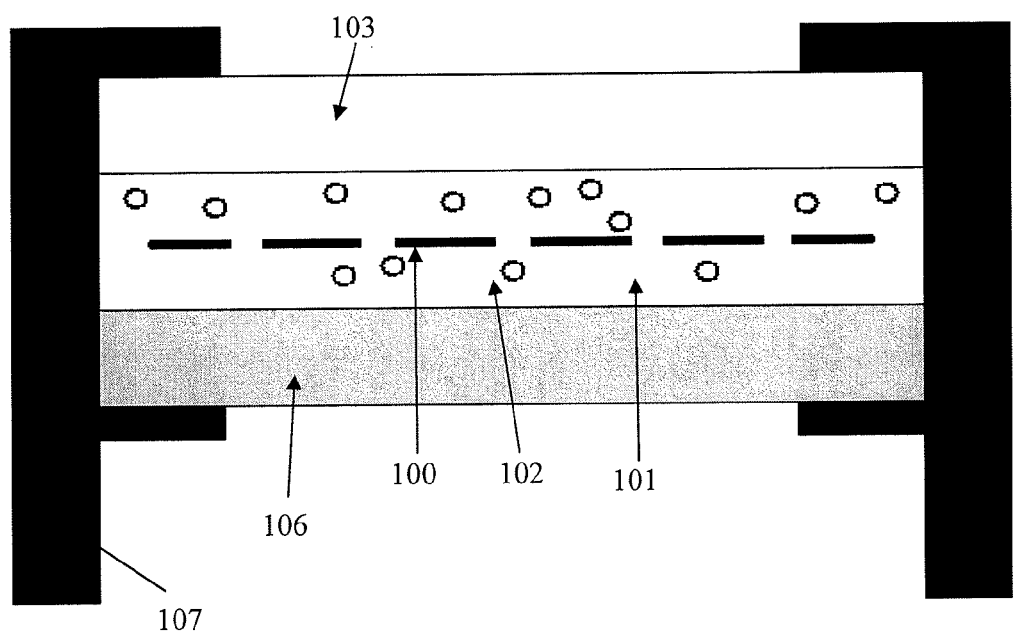
FIG. 11 illustrates an example embodiment of an encapsulation structure where a solar panel with several solar cell devices utilizes a luminescent wavelength conversion material to encapsulate the solar cell devices, a back sheet is underneath the light incident surface of the solar cell devices, a glass top sheet provides environmental protection, and a frame holds the panel together.

In some embodiments, additional materials may also be utilized to provide increased environmental protection. Glass or plastic sheets are often used as an environmental protective cover and may be applied both on top of and/or underneath the solar module devices once encapsulated with the luminescent wavelength conversion material. In some embodiments, a sealing tape may be applied to the perimeter of the device to prevent ingress of oxygen or moisture through the sides. In some embodiments, a back sheet may also be used underneath the solar module devices to reflect and refract incident light that was not absorbed by the solar cell. In some embodiments, the encapsulated solar devices may also be put in a frame, such as those utilized to form solar panels or solar strings. FIGS. 10 and 11 illustrate example embodiments of the encapsulation structure used in a solar module device.

A chromophore, also referred to as a luminescent dye or fluorescent dye, is a compound that absorbs photons of a particular wavelength or wavelength range, and re-emits the photon at a different wavelength. Since solar cells and photovoltaic devices are often exposed to extreme environmental conditions for long periods of time (i.e. 20+ years) the stability of the chromophore is important. In some embodiments, only chromophores or chromophore compounds with good photostabilty for long periods of time (i.e. 20,000+ hours of illumination under one sun (AM1.5G) irradiation with <10% degradation) are used in the luminescent wavelength conversion material. In some embodiments, of the encapsulation structure, two or more chromophores are contained in the luminescent wavelength conversion material.

In some embodiments, the wavelength conversion material may be comprised of several layers. In some embodiments, the two or more chromophores may be located in the same luminescent wavelength conversion material layer or they may be in separate material layers. It may be desirable to have multiple chromophores or luminescent dyes in the wavelength conversion material, depending on the solar module that the material is to encapsulate. For example, a first chromophore may act to convert photons of wavelengths 400-450 nm to wavelengths of 500 nm, and a second chromophore may act to convert photons of wavelengths 450-475 nm to wavelengths of 500 nm, wherein the solar module system that is to be encapsulated by the material exhibits optimum photoelectric conversion efficiency at 500 nm wavelengths, so that the encapsulation of the devices by the luminescent wavelength conversion material significantly enhances the solar harvesting efficiency of the solar module system.

Additionally, in some embodiments of the encapsulation structure, at least one of the chromophores is an up-conversion dye, or up-shifting dye, meaning a chromophore that converts photons from lower energy (long wavelengths) to higher energy (short wavelengths). Up-conversion dyes may include rare earth materials which have been found to absorb photons of wavelengths in the IR region, ~975 nm, and re-emit in the visible region (400-700 nm), for example, $Yb^{3+}$, $Tm^{3+}$, $Er^{3+}$, $Ho^{3+}$, and $NaYF^4$. Additional up-conversion materials are described in U.S. Pat. Nos. 6,654,161, and 6,139,210, and in the Indian Journal of Pure and Applied Physics, volume 33, pages 169-178, (1995), which are hereby incorporated by reference in their entirety.

In some embodiments of the encapsulation structure, at least one of the chromophores is a down-conversion, or down-shifting dye, meaning a chromophore that converts photons of high energy (short wavelengths) into lower energy (long wavelengths).

In some embodiments of the encapsulation structure, the wavelength conversion material is comprised of an optically transparent polymer matrix. In some embodiments, the optically transparent polymer matrix is formed from a substance selected from the group consisting of polyethylene terephthalate, polymethyl methacrylate, polyvinyl butyral, ethylene vinyl acetate, ethylene tetrafluoroethylene, polyimide, amorphous polycarbonate, polystyrene, siloxane sol-gel, polyurethane, polyacrylate, and combinations thereof.

In some embodiments of the encapsulation structure, the optically transparent polymer matrix comprises more than one polymer. In some embodiments, the optically transparent polymer matrix comprises one host polymer, a host polymer and a co-polymer, or multiple polymers. In some embodiments, the refractive index of the polymer matrix material is in the range of about 1.4 to about 1.7. In some embodiments, the refractive index of the polymer matrix material is in the range of about 1.45 to about 1.55.

In some embodiments, the luminescent dye, or chromophore, is present in the polymer matrix in an amount in the range of about 0.01 wt % to about 3 wt %. In some embodiments, the chromophore is present in the polymer matrix in an amount in the range of about 0.05 wt % to about 1 wt %.

The chromophores represented by general formulae I-a, I-b, II-a, II-b, III-a, III-b, IV, and V are useful as fluorescent dyes in various applications, including in wavelength conversion films. As shown in the formulae, the dye comprises a benzo heterocyclic system or a perylene derivative. Additional detail and examples, without limiting the scope of the invention, on the types of compounds that can be used are described below.

As used herein, an "electron donor group" is defined as any group which increases the electron density of the 2H-benzo [d][1,2,3]triazole system.

An "electron donor linker" is defined as any group that can link two 2H-benzo[d][1,2,3]triazole systems providing conjugation of their π orbitals, which can also increase or have neutral effect on the electron density of the 2H-benzo[d][1,2,3]triazole to which they are connected.

An "electron acceptor group" is defined as any group which decreases the electron density of the 2H-benzo[d][1,2,3]triazole system. The placement of an electron acceptor group at the N-2 position of the 2H-benzo[d][1,2,3]triazole ring system.

The term "alkyl" refers to a branched or straight fully saturated acyclic aliphatic hydrocarbon group (i.e. composed of carbon and hydrogen containing no double or triple bonds). Alkyls include, but are not limited to, methyl, ethyl, propyl, isopropyl, butyl, isobutyl, tertiary butyl, pentyl, hexyl, and the like.

The term "cycloalkyl" used herein refers to saturated aliphatic ring system radical having three to twenty carbon atoms including, but not limited to, cyclopropyl, cyclopentyl, cyclohexyl, cycloheptyl, and the like.

The term "alkenyl" used herein refers to a monovalent straight or branched chain radical of from two to twenty carbon atoms containing a carbon double bond including, but not limited to, 1-propenyl, 2-propenyl, 2-methyl-1-propenyl, 1-butenyl, 2-butenyl, and the like.

The term "alkynyl" used herein refers to a monovalent straight or branched chain radical of from two to twenty carbon atoms containing a carbon triple bond including, but not limited to, 1-propynyl, 1-butynyl, 2-butynyl, and the like.

The term "aryl" used herein refers to homocyclic aromatic radical whether one ring or multiple fused rings. Examples of aryl groups include, but are not limited to, phenyl, naphthyl, phenanthrenyl, naphthacenyl, fluorenyl, pyrenyl, and the like. Further examples include:

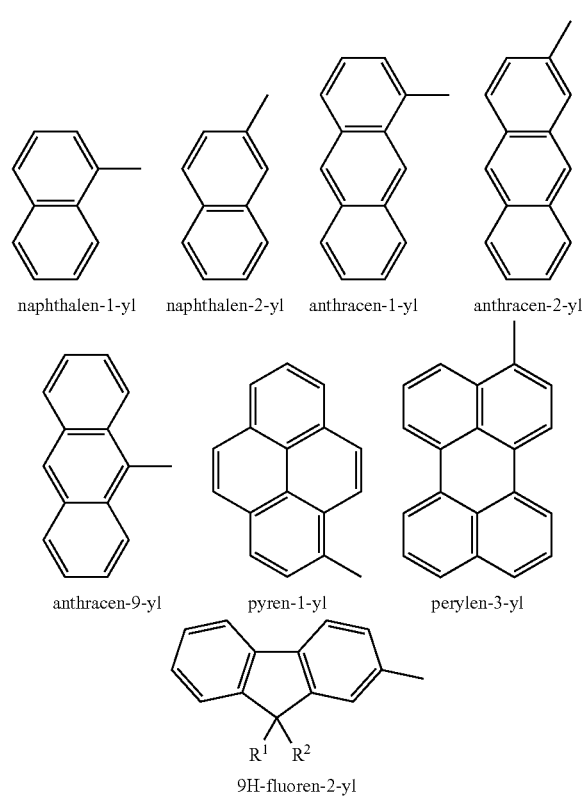

naphthalen-1-yl  naphthalen-2-yl  anthracen-1-yl  anthracen-2-yl anthracen-9-yl  pyren-1-yl  perylen-3-yl 9H-fluoren-2-yl The term "alkaryl" or "alkylaryl" used herein refers to an alkyl-substituted aryl radical. Examples of alkaryl include, but are not limited to, ethylphenyl, 9,9-dihexyl-9H-fluorene, and the like.

The term "aralkyl" or "arylalkyl" used herein refers to an aryl-substituted alkyl radical. Examples of aralkyl include, but are not limited to, phenylpropyl, phenylethyl, and the like.

The term "heteroaryl" used herein refers to an aromatic ring system radical in which one or more ring atoms are heteroatoms, whether one ring or multiple fused rings. When two or more heteroatoms are present, they may be the same or different. In fused ring systems, the one or more heteroatoms may be present in only one of the rings. Examples of heteroaryl groups include, but are not limited to, benzothiazyl, benzoxazyl, quinazolinyl, quinolinyl, isoquinolinyl, quinoxalinyl, pyridinyl, pyridazinyl, pyrimidinyl, pyrazinyl, pyrrolyl, oxazolyl, indolyl, thiazyl, and the like. Further examples of substituted and unsubstituted heteroaryl rings include:

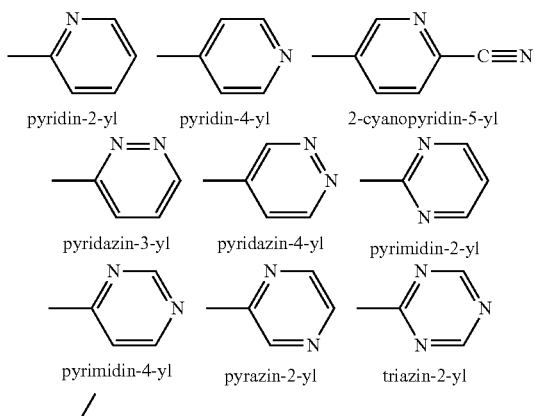

pyridin-2-yl  pyridin-4-yl  2-cyanopyridin-5-yl pyridazin-3-yl  pyridazin-4-yl  pyrimidin-2-yl pyrimidin-4-yl  pyrazin-2-yl  triazin-2-yl

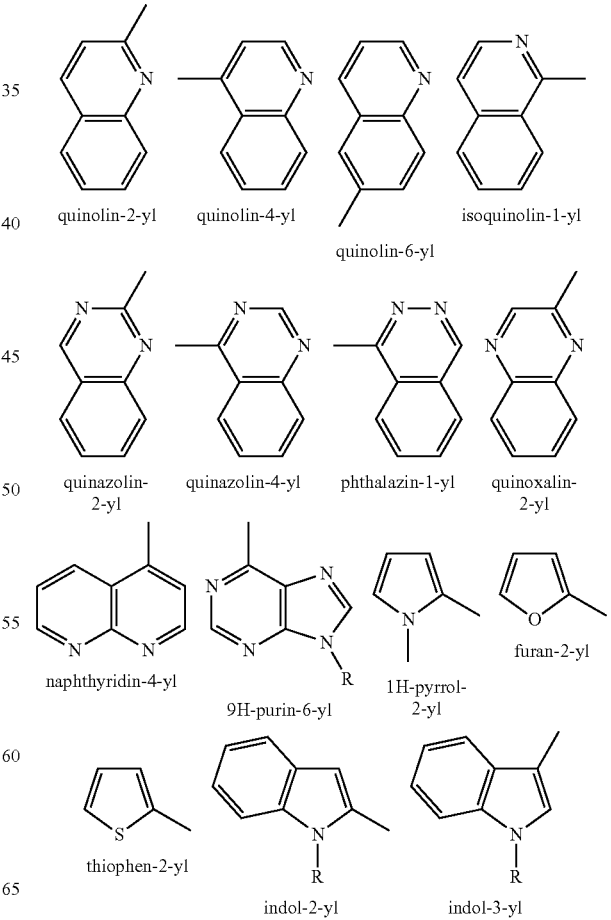

quinolin-2-yl  quinolin-4-yl  isoquinolin-1-yl quinolin-6-yl quinazolin-2-yl  quinazolin-4-yl  phthalazin-1-yl  quinoxalin-2-yl naphthyridin-4-yl  9H-purin-6-yl  1H-pyrrol-2-yl  furan-2-yl thiophen-2-yl  indol-2-yl  indol-3-yl -continued

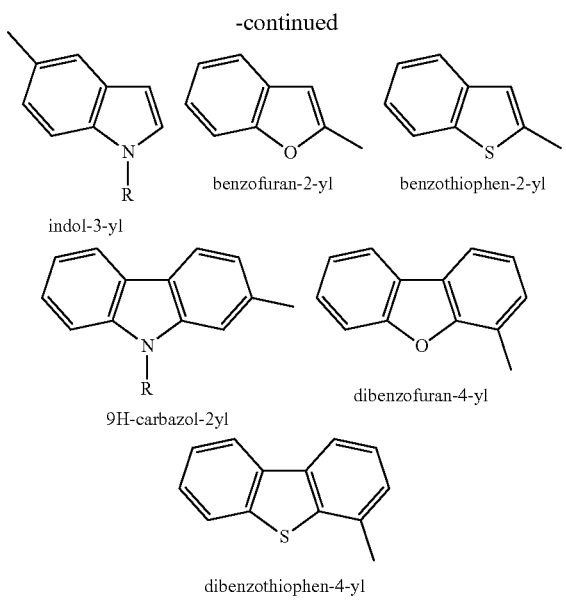

indol-3-yl
benzofuran-2-yl
benzothiophen-2-yl
9H-carbazol-2yl
dibenzofuran-4-yl
dibenzothiophen-4-yl The term "alkoxy" used herein refers to straight or branched chain alkyl radical covalently bonded to the parent molecule through an —O— linkage. Examples of alkoxy groups include, but are not limited to, methoxy, ethoxy, propoxy, isopropoxy, butoxy, n-butoxy, sec-butoxy, t-butoxy and the like.

The term "heteroatom" used herein refers to S (sulfur), N (nitrogen), and O (oxygen).

The term "cyclic amino" used herein refers to either secondary or tertiary amines in a cyclic moiety. Examples of cyclic amino groups include, but are not limited to, aziridinyl, piperidinyl, N-methylpiperidinyl, and the like.

The term "cyclic imido" used herein refers to an imide in the radical of which the two carbonyl carbons are connected by a carbon chain. Examples of cyclic imide groups include, but are not limited to, 1,8-naphthalimide, pyrrolidine-2,5-dione, 1H-pyrrole-2,5-dione, and the likes.

The term "aryloxy" used herein refers to an aryl radical covalently bonded to the parent molecule through an —O— linkage.

The term "acyloxy" used herein refers to a radical R—C(=O)O—,

The term "carbamoyl" used herein refers to —NHC(=O)R.

The term "keto" and "carbonyl" used herein refers to C=O.

The term "carboxy" used herein refers to —COOH.

The term "ester" used herein refers to C(=O)O.

The term "amido" used herein refers to —NRC(=O)R'.

The term "amino" used herein refers to —NR'R''

As used herein, a substituted group is derived from the unsubstituted parent structure in which there has been an exchange of one or more hydrogen atoms for another atom or group. When substituted, the substituent group(s) is (are) one or more group(s) individually and independently selected from $C_1$-$C_6$ alkyl, $C_1$-$C_6$ alkenyl, $C_1$-$C_6$ alkynyl, $C_3$-$C_7$ cycloalkyl (optionally substituted with halo, alkyl, alkoxy, carboxyl, haloalkyl, CN, —$SO_2$-alkyl, —$CF_3$, and —$OCF_3$), cycloalkyl geminally attached, $C_1$-$C_6$ heteroalkyl, $C_3$-$C_{10}$ heterocycloalkyl (e.g., tetrahydrofuryl) (optionally substituted with halo, alkyl, alkoxy, carboxyl, CN, —$SO_2$-alkyl, —$CF_3$, and —$OCF_3$), aryl (optionally substituted with halo, alkyl, aryl optionally substituted with $C_1$-$C_6$ alkyl, arylalkyl, alkoxy, aryloxy, carboxyl, amino, imido, amido (carbamoyl), optionally substituted cyclic imido, cylic amido, CN, —NH—C(=O)-alkyl, —$CF_3$, and —$OCF_3$), arylalkyl (optionally substituted with halo, alkyl, alkoxy, aryl, carboxyl, CN, —$SO_2$-alkyl, —$CF_3$, and —$OCF_3$), heteroaryl (optionally substituted with halo, alkyl, alkoxy, aryl, heteroaryl, aralkyl, carboxyl, CN, —$SO_2$-alkyl, —$CF_3$, and —$OCF_3$), halo (e.g., chloro, bromo, iodo and fluoro), cyano, hydroxy, optionally substituted cyclic imido, amino, imido, amido, —$CF_3$, $C_1$-$C_6$ alkoxy, aryloxy, acyloxy, sulfhydryl (mercapto), halo($C_1$-$C_6$)alkyl, $C_1$-$C_6$ alkylthio, arylthio, mono- and di-($C_1$-$C_6$)alkyl amino, quaternary ammonium salts, amino ($C_1$-$C_6$)alkoxy, hydroxy($C_1$-$C_6$)alkylamino, amino ($C_1$-$C_6$)alkylthio, cyanoamino, nitro, carbamoyl, keto (oxy), carbonyl, carboxy, glycolyl, glycyl, hydrazino, guanyl, sulfamyl, sulfonyl, sulfinyl, thiocarbonyl, thiocarboxy, sulfonamide, ester, C-amide, N-amide, N-carbamate, O-carbamate, urea and combinations thereof. Wherever a substituent is described as "optionally substituted" that substituent can be substituted with the above substituents.

Formulae I-a and I-b

Some embodiments provide a chromophore having one of the structures below:

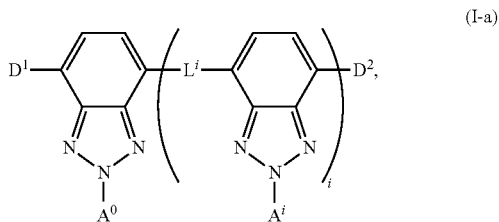

(I-a)

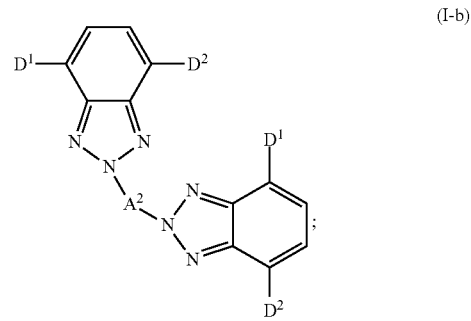

(I-b)

wherein $D^1$ and $D^2$ are electron donating groups, $L^i$ is an electron donor linker, and $A^0$ and $A^i$ are electron acceptor groups. In some embodiments, where more than one electron donor group is present, the other electron donor groups may be occupied by another electron donor, a hydrogen atom, or another neutral substituent. In some embodiments, at least one of the $D^1$, $D^2$, and $L^i$ is a group which increases the electron density of the 2H-benzo[d][1,2,3]triazole system to which it is attached.

In formulae I-a and I-b, i is an integer in the range of 0 to 100. In some embodiments, i is an integer in the range of 0 to 50, 0 to 30, 0 to 10, 0 to 5, or 0 to 3. In some embodiments, i is 0, 1, 2, 3, 4, 5, 6, 7, 8, 9, or 10.

In formulae I-a and I-b, $A^0$ and $A^i$ are each independently selected from the group consisting of optionally substituted alkyl, optionally substituted alkenyl, optionally substituted heteroalkyl, optionally substituted aryl, optionally substituted heteroaryl, optionally substituted amino, optionally substituted amido, optionally substituted cyclic amido, optionally substituted cyclic imido, optionally substituted alkoxy, and optionally substituted carboxy, and optionally substituted carbonyl.

In some embodiments, $A^0$ and $A^i$ are each independently selected from the group consisting of optionally substituted heteroaryl, optionally substituted aryl, optionally substituted cyclic imido, optionally substituted $C_{1-8}$ alkyl, and optionally substituted $C_{1-8}$ alkenyl; wherein the substituent for optionally substituted heteroaryl is selected from the group consisting of alkyl, aryl and halogen; the substituent for optionally substituted aryl is $-NR^1-C(=O)R^2$ or optionally substituted cyclic imido, wherein $R^1$ and $R^2$ are as described above.

In some embodiments, $A^0$ and $A^i$ are each independently phenyl substituted with a moiety selected from the group consisting of $-NR^1-C(=O)R^2$ and optionally substituted cyclic imido, wherein $R^1$ and $R^2$ are as described above.

In some embodiments, $A^0$ and $A^i$ are each optionally substituted heteroaryl or optionally substituted cyclic imido; wherein the substituent for optionally substituted heteroaryl and optionally substituted cyclic imido is selected from the group consisting of alkyl, aryl and halogen. In some embodiments, at least one of the $A^0$ and $A^i$ is selected from the group consisting of: optionally substituted pyridinyl, optionally substituted pyridazinyl, optionally substituted pyrimidinyl, optionally substituted pyrazinyl, optionally substituted triazinyl, optionally substituted quinolinyl, optionally substituted isoquinolinyl, optionally substituted quinazolinyl, optionally substituted phthalazinyl, optionally substituted quinoxalinyl, optionally substituted naphathyridinyl, and optionally substituted purinyl.

In other embodiments, $A^0$ and $A^i$ are each optionally substituted alkyl. In other embodiments, $A^0$ and $A^i$ are each optionally substituted alkenyl. In some embodiments, at least one of the $A^0$ and $A^i$ is selected from the group consisting of:

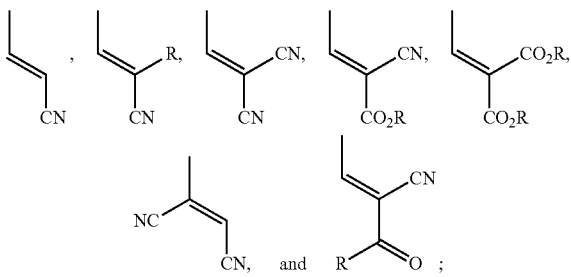

wherein R is optionally substituted alkyl.

In formula I-a and I-b, $A^2$ is selected from the group consisting of optionally substituted alkylene, optionally substituted alkenylene, optionally substituted arylene, optionally substituted heteroarylene, ketone, ester, and

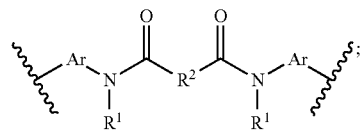

wherein Ar is optionally substituted aryl or optionally substituted heteroaryl. $R^1$ is selected from the group consisting of H, alkyl, alkenyl, aryl, heteroaryl, aralkyl, alkaryl; and $R^2$ is selected from the group consisting of optionally substituted alkylene, optionally substituted alkenylene, optionally substituted arylene, optionally substituted heteroarylene, ketone, and ester; or $R^1$ and $R^2$ may be connected together to form a ring.

In some embodiments, $A^2$ is selected from the group consisting of optionally substituted arylene, optionally substituted heteroarylene, and

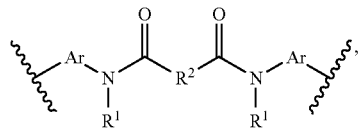

wherein Ar, $R^1$ and $R^2$ are as described above.

In formulae I-a and I-b, $D^1$ and $D^2$ are each independently selected from the group consisting of hydrogen, optionally substituted alkoxy, optionally substituted aryloxy, optionally substituted acyloxy, optionally substituted alkyl, optionally substituted aryl, optionally substituted heteroaryl, optionally substituted amino, amido, cyclic amido, and cyclic imido, provided that $D^1$ and $D^2$ are not both hydrogen.

In some embodiments, $D^1$ and $D^2$ are each independently selected from the group consisting of hydrogen, optionally substituted aryl, optionally substituted heteroaryl, and amino, provided that $D^1$ and $D^2$ are not both hydrogen. In some embodiments, $D^1$ and $D^2$ are each independently selected from the group consisting of hydrogen, optionally substituted aryl, optionally substituted heteroaryl, and diphenylamino, provided that $D^1$ and $D^2$ are not both hydrogen.

In some embodiments, $D^1$ and $D^2$ are each independently optionally substituted aryl. In some embodiments, $D^1$ and $D^2$ are each independently phenyl optionally substituted by alkoxy or amino. In other embodiments, $D^1$ and $D^2$ are each independently selected from hydrogen, optionally substituted benzofuranyl, optionally substituted thiophenyl, optionally substituted furanyl, dihydrothienodioxinyl, optionally substituted benzothiophenyl, and optionally substituted dibenzothiophenyl, provided that $D^1$ and $D^2$ are not both hydrogen.

In some embodiments, the substituent for optionally substituted aryl and soptionally substituted heteroaryl may be selected from the group consisting of alkoxy, aryloxy, aryl, heteroaryl, and amino.

In formulae I-a and I-b, $L^i$ is independently selected from the group consisting of optionally substituted alkylene, optionally substituted alkenylene, optionally substituted alkynylene, optionally substituted arylene, optionally substituted heteroarylene. In some embodiments, $L^i$ is selected from the group consisting of optionally substituted heteroarylene and optionally substituted arylene.

In some embodiments, at least one of the $L^i$ is selected from the group consisting of: 1,2-ethylene, acetylene, 1,4-phenylene, 1,1'-biphenyl-4,4'-diyl, naphthalene-2,6-diyl, naphthalene-1,4-diyl, 9H-fluorene-2,7-diyl, perylene-3,9-diyl, perylene-3,10-diyl, or pyrene-1,6-diyl, 1H-pyrrole-2,5-diyl, furan-2,5-diyl, thiophen-2,5-diyl, thieno[3,2-b]thiophene-2,5-diyl, benzo[c]thiophene-1,3-diyl, dibenzo[b]thiophene-2,8-diyl, 9H-carbozole-3,6-diyl, 9H-carbozole-2,7-diyl, dibenzo[b,d]furan-2,8-diyl, 10H-phenothiazine-3,7-diyl, and 10H-phenothiazine-2,8-diyl; wherein each moiety is optionally substituted.

Formulae II-a and II-b

Some embodiments provide a chromophore having one of the structures below:

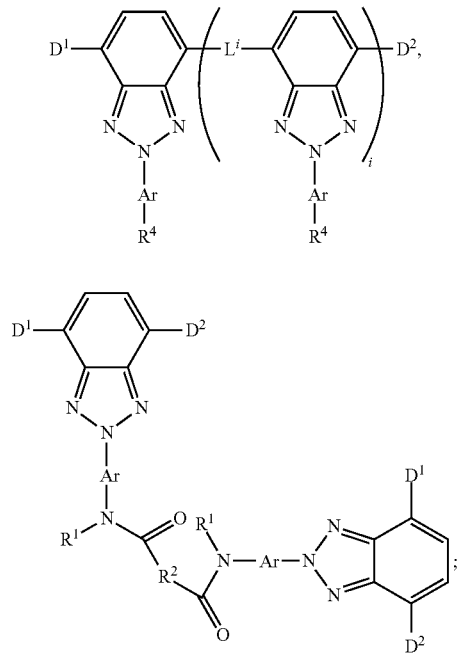

wherein i is an integer in the range of 0 to 100. In some embodiments, i is an integer in the range of 0 to 50, 0 to 30, 0 to 10, 0 to 5, or 0 to 3. In some embodiments, i is 0, 1, 2, 3, 4, 5, 6, 7, 8, 9, or 10.

In formulae II-a and II-b, Ar is optionally substituted aryl or optionally substituted heteroaryl. In some embodiments, aryl substituted with an amido or a cyclic imido group at the N-2 position of the 2H-benzo[d][1,2,3]triazole ring system provides unexpected and improved benefits.

In formulae II-a and IIb, $R^4$ is

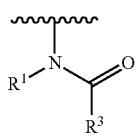

or optionally substituted cyclic imido; $R^1$ is each independently selected from the group consisting of H, alkyl, alkenyl, aryl, heteroaryl, aralkyl, alkaryl; $R^3$ is each independently selected from the group consisting of optionally substituted alkyl, optionally substituted alkenyl, optionally substituted aryl, optionally substituted heteroaryl; or R' and R" may be connected together to form a ring.

In some embodiments, $R^4$ is optionally substituted cyclic imido selected from the group consisting of:

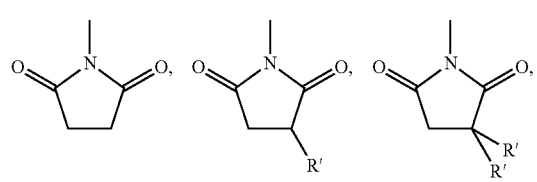

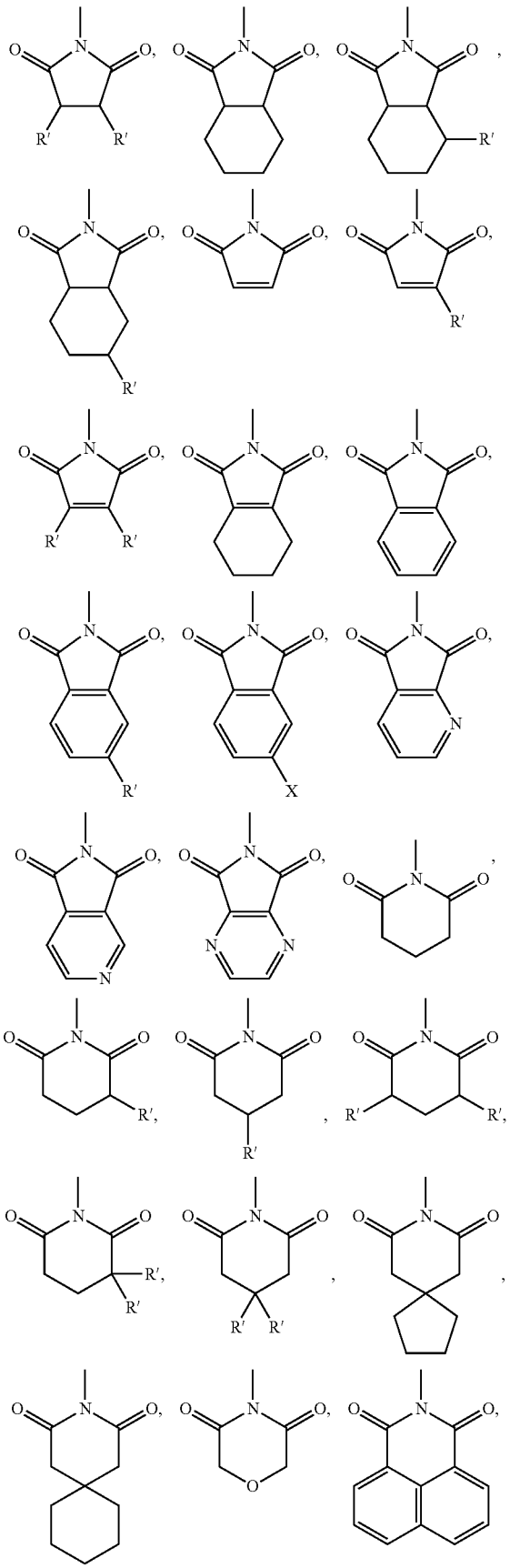

-continued

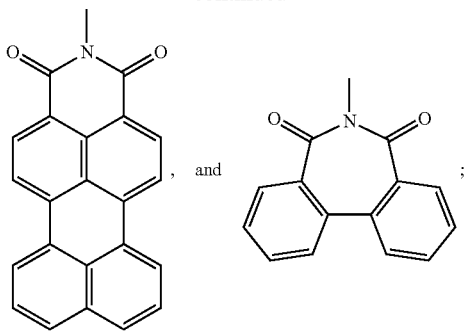
, and ;

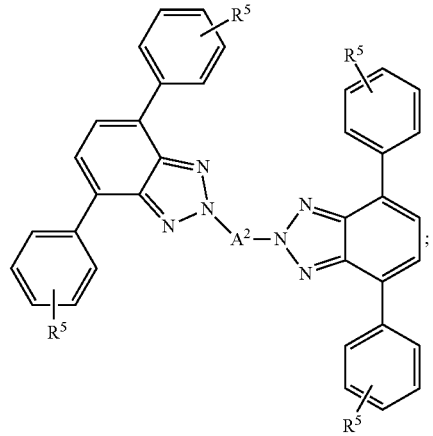

and wherein R' is each optionally substituted alkyl or optionally substituted aryl; and X is optionally substituted heteroalkyl.

In formulae II-a and II-b, $R^2$ is selected from the group consisting of optionally substituted alkylene, optionally substituted alkenylene, optionally substituted arylene, optionally substituted heteroarylene.

In formulae II-a and II-b, $D^1$ and $D^2$ are each independently selected from the group consisting of hydrogen, optionally substituted alkoxy, optionally substituted aryloxy, optionally substituted acyloxy, optionally substituted alkyl, optionally substituted aryl, optionally substituted heteroaryl, optionally substituted amino, amido, cyclic amido, and cyclic imido, provided that $D^1$ and $D^2$ are not both hydrogen.

In formulae II-a and II-b, $L^i$ is independently selected from the group consisting of optionally substituted alkylene, optionally substituted alkenylene, optionally substituted alkynylene, optionally substituted arylene, optionally substituted heteroarylene.

In some embodiments, at least one of the $L^i$ is selected from the group consisting of: 1,2-ethylene, acetylene, 1,4-phenylene, 1,1'-biphenyl-4,4'-diyl, naphthalene-2,6-diyl, naphthalene-1,4-diyl, 9H-fluorene-2,7-diyl, perylene-3,9-diyl, perylene-3,10-diyl, or pyrene-1,6-diyl, 1H-pyrrole-2,5-diyl, furan-2,5-diyl, thiophen-2,5-diyl, thieno[3,2-b]thiophene-2,5-diyl, benzo[c]thiophene-1,3-diyl, dibenzo[b]thiophene-2,8-diyl, 9H-carbozole-3,6-diyl, 9H-carbozole-2,7-diyl, dibenzo[b,d]furan-2,8-diyl, 10H-phenothiazine-3,7-diyl, and 10H-phenothiazine-2,8-diyl; wherein each moiety is optionally substituted.

Formulae III-a and III-b

Some embodiments provide a chromophore having one of the structures below:

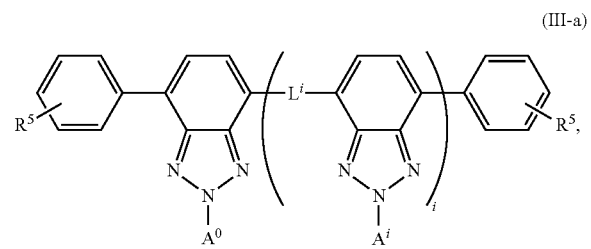
(III-a)

The placement of an alkyl group in formulae (III-a) and (III-b) at the N-2 position of the 2H-benzo[d][1,2,3]triazole ring system along with substituted phenyls at the C-4 and C-7 positions provides unexpected and improved benefits. In formula III-a and III-b, is an integer in the range of 0 to 100. In some embodiments, i is an integer in the range of 0 to 50, 0 to 30, 0 to 10, 0 to 5, or 0 to 3. In some embodiments, i is 0, 1, 2, 3, 4, 5, 6, 7, 8, 9, or 10.

In formula III-a and III-b, $A^0$ and $A^i$ are each independently selected from the group consisting of optionally substituted alkyl, optionally substituted alkenyl, optionally substituted heteroalkyl, optionally substituted amido, optionally substituted alkoxy, optionally substituted cabonyl, and optionally substituted carboxy.

In some embodiments, $A^0$ and $A^i$ are each independently unsubstituted alkyl or alkyl substituted by a moiety selected from the group consisting of: —NRR", —OR, —COOR, —COR, —CONHR, —CONRR", halo and —CN; wherein R is $C_1$-$C_{20}$ alkyl, and R" is hydrogen or $C_1$-$C_{20}$ alkyl. In some embodiments, the optionally substituted alkyl may be optionally substituted $C_1$-$C_{40}$ alkyl. In some embodiments, $A^0$ and the $A^i$ are each independently $C_1$-$C_{40}$ alkyl or $C_1$-$C_{20}$ haloalkyl.

In some embodiments, $A^0$ and $A^i$ are each independently $C_1$-$C_{20}$ haloalkyl, $C_1$-$C_{40}$ arylalkyl, or $C_1$-$C_{20}$ alkenyl.

In formulae III-a and III-b, each $R^5$ is independently selected from the group consisting of optionally substituted alkoxy, optionally substituted aryloxy, optionally substituted acyloxy, and amino. In some embodiments, $R^5$ may attach to phenyl ring at ortho and/or para position. In some embodiments, $R^5$ is independently selected from $C_1$-$C_{40}$ alkoxy, In formulae III-a and III-b, $A^2$ is selected from the group consisting of optionally substituted alkylene, optionally substituted alkenylene, optionally substituted arylene, optionally substituted heteroarylene, ketone, ester, and

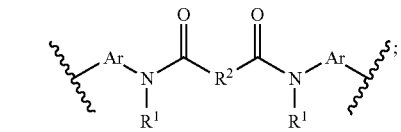

wherein Ar is optionally substituted aryl or optionally substituted heteroaryl, $R^1$ is selected from the group consisting of H, alkyl, alkenyl, aryl, heteroaryl, aralkyl, alkaryl; and $R^2$ is selected from the group consisting of optionally substituted alkylene, optionally substituted alkenylene, optionally substituted arylene, optionally substituted heteroarylene, ketone, and ester; or $R^1$ and $R^2$ may be connected together to form a ring.

In formulae III-a and III-b, $L^i$ is independently selected from the group consisting of optionally substituted alkylene, optionally substituted alkenylene, optionally substituted alkynylene, optionally substituted arylene, optionally substituted heteroarylene.

In some embodiments, at least one of the $L^i$ is selected from the group consisting of 1,2-ethylene, acetylene, 1,4-phenylene, 1,1'-biphenyl-4,4'-diyl, naphthalene-2,6-diyl, naphthalene-1,4-diyl, 9H-fluorene-2,7-diyl, perylene-3,9-diyl, perylene-3,10-diyl, or pyrene-1,6-diyl, 1H-pyrrole-2,5-diyl, furan-2,5-diyl, thiophen-2,5-diyl, thieno[3,2-b]thiophene-2,5-diyl benzo[c]thiophene-1,3-diyl, dibenzo[b]thiophene-2,8-diyl, 9H-carbozole-3,6-diyl, 9H-carbozole-2,7-diyl, dibenzo[b,d]furan-2,8-diyl, 10H-phenothiazine-3,7-diyl, and 10H-phenothiazine-2,8-diyl; wherein each moiety is optionally substituted.

Formula IV

Some embodiments provide a chromophore having the structure below:

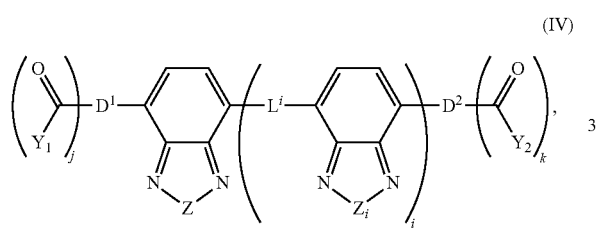

(IV)

wherein i is an integer in the range of 0 to 100. In some embodiments, i is an integer in the range of 0 to 50, 0 to 30, 0 to 10, 0 to 5, or 0 to 3. In some embodiments, i is 0, 1, 2, 3, 4, 5, 6, 7, 8, 9, or 10.

In formula IV, Z and $Z_i$ are each independently selected from the group consisting of —O—, —S—, —Se—, —Te—, —$NR^6$—, —$CR^6$=$CR^6$—, and —$CR^6$=N—, wherein $R^6$ is hydrogen, optionally substitute $C_1$-$C_6$ alkyl, or optionally substituted $C_1$-$C_{10}$ aryl; and In formula IV, $D^1$ and $D^2$ are independently selected from the group consisting of optionally substituted alkoxy, optionally substituted aryloxy, optionally substituted acyloxy, optionally substituted alkyl, optionally substituted aryl, optionally substituted heteroaryl, optionally substituted amino amido, cyclic amido, and cyclic imido; j is 0, 1 or 2, and k is 0, 1, or 2. In some embodiments, the —C(=O)$Y_1$ and —C(O)$Y_2$ groups may attach to the substituent(s) of the optionally substituted moiety for $D^1$ and $D^2$.

In formula IV, $Y_1$ and $Y_2$ are independently selected from the group consisting of optionally substituted aryl, optionally substituted alkyl, optionally substituted cycloalkyl, optionally substituted alkoxy, and optionally substituted amino; and In formula IV, $L^i$ is independently selected from the group consisting of optionally substituted alkylene, optionally substituted alkenylene, optionally substituted alkynylene, optionally substituted arylene, optionally substituted heteroarylene.

In some embodiments, at least one of the $L^i$ is selected from the group consisting of: 1,2-ethylene, acetylene, 1,4-phenylene, 1,1'-biphenyl-4,4'-diyl, naphthalene-2,6-diyl, naphthalene-1,4-diyl, 9H-fluorene-2,7-diyl, perylene-3,9-diyl, perylene-3,10-diyl, or pyrene-1,6-diyl, 1H-pyrrole-2,5-diyl, furan-2,5-diyl, thiophen-2,5-diyl, thieno[3,2-b]thiophene-2,5-diyl, benzo[c]thiophene-1,3-diyl, dibenzo[b,d]thiophene-2,8-diyl, 9H-carbozole-3,6-diyl, 9H-carbozole-2,7-diyl, dibenzo[b,d]furan-2,8-diyl, 10H-phenothiazine-3,7-diyl, and 10H-phenothiazine-2,8-diyl; wherein each moiety is optionally substituted.

With regard to $L^i$ in any of the formulae above, the electron linker represents a conjugated electron system, which may be neutral or serve as an electron donor itself. In some embodiments, some examples are provided below, which may or may not contain additional attached substituents.

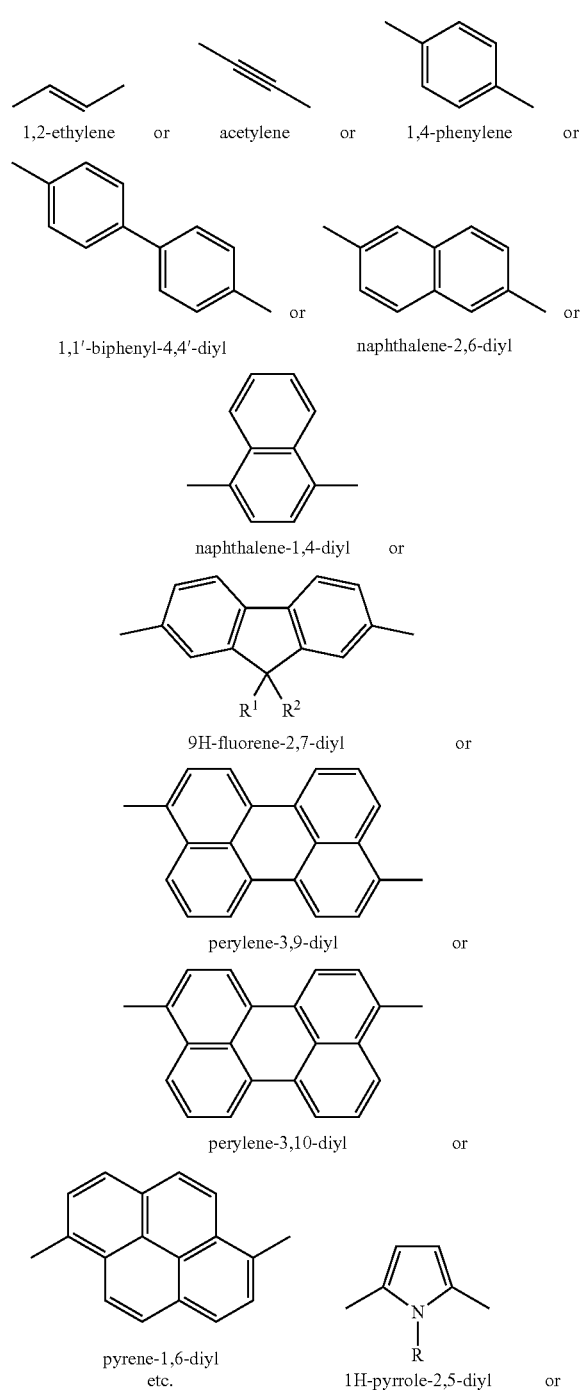

-continued

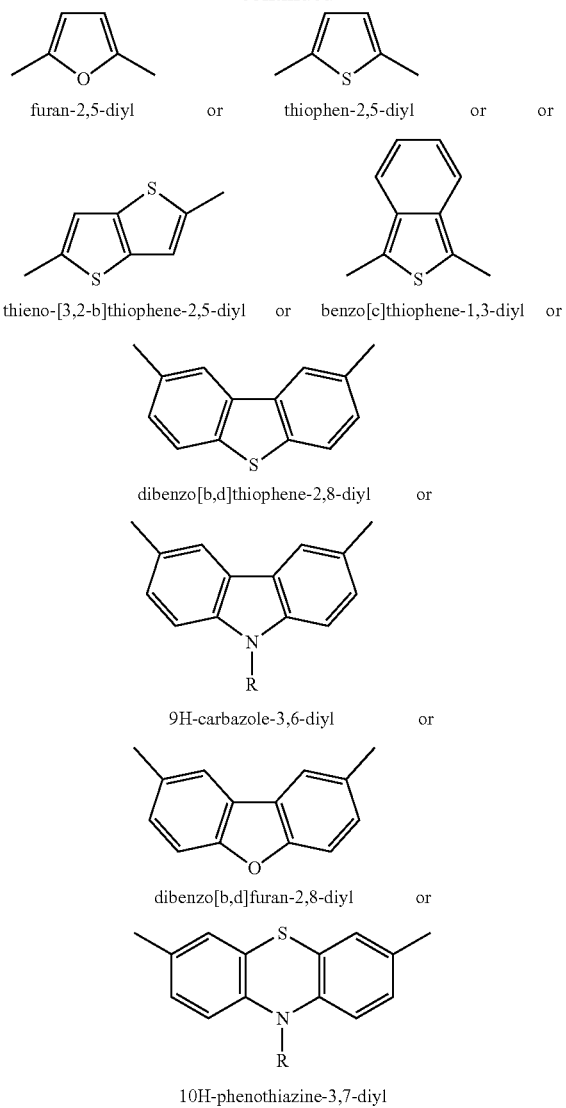

etc.

Formulae V-a and V-b

Some embodiments provide a perylene diester derivative represented by the following general formula (V-a) or general formula (V-b):

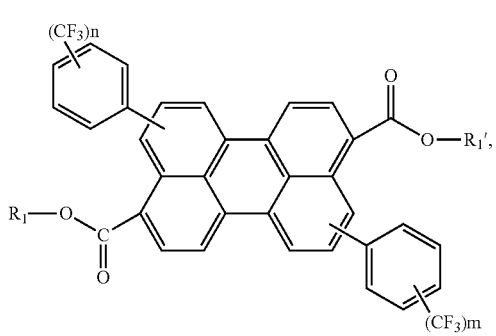

-continued

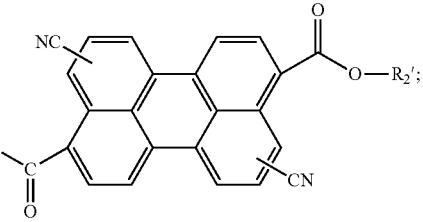

wherein $R_1$ and $R_1$ in formula (I) are each independently selected from the group consisting of hydrogen, $C_1$-$C_{10}$ alkyl, $C_3$-$C_{10}$ cycloalkyl, $C_2$-$C_{10}$ alkoxyalkyl, $C_6$-$C_{18}$ aryl, and $C_6$-$C_{20}$ aralkyl; m and n in formula (I) are each independently in the range of from 1 to 5; and $R_2$ and $R_2$ in formula (II) are each independently selected from the group consisting of a $C_6$-$C_{18}$ aryl and $C_6$-$C_{20}$ aralkyl. In an embodiment, if one of the cyano groups on formula (II) is present on the 4-position of the perylene ring, then the other cyano group is not present on the 10-position of the perylene ring. In an embodiment, if one of the cyano groups on formula (II) is present on the 10-position of the perylene ring, then the other cyano group is not present on the 4-position of the perylene ring.

In an embodiment, $R_1$ and $R_1'$ are independently selected from the group consisting of hydrogen, $C_1$-$C_6$ alkyl, $C_2$-$C_6$ alkoxyalkyl, and $C_6$-$C_{18}$ aryl. In an embodiment, $R_1$ and $R_1'$ are each independently selected from the group consisting of isopropyl, isobutyl, isohexyl, isooctyl, 2-ethyl-hexyl, diphenylmethyl, trityl, and diphenyl. In an embodiment, $R_2$ and $R_2'$ are independently selected from the group consisting of diphenylmethyl, trityl, and diphenyl. In an embodiment, each m and n in formula (I) is independently in the range of from 1 to 4.

In some embodiments, the luminescent wavelength conversion material of the encapsulation structure further comprises one or more sensitizers. In some embodiments, the sensitizer comprises nanoparticles, nanometals, nanowires, or carbon nanotubes. In some embodiments, the sensitizer comprises a fullerene. In some embodiments, the fullerene is selected from the group consisting of optionally substituted $C_{60}$, optionally substituted $C_{70}$, optionally substituted $C_{84}$, optionally substituted single-wall carbon nanotube, and optionally substituted multi-wall carbon nanotube. In some embodiments, the fullerene is selected from the group consisting of [6,6]-phenyl-$C_{61}$-butyricacid-methylester, [6,6]-phenyl-$C_{71}$-butyricacid-methylester, and [6,6]-phenyl-$C_{85}$-butyricacid-methylester. In some embodiments, the sensitizer is selected from the group consisting of optionally substituted phthalocyanine, optionally substituted perylene, optionally substituted porphyrin, and optionally substituted terrylene. In some embodiments, the luminescent wavelength conversion material of the encapsulation structure further comprises a combination of sensitizers, wherein the combination of sensitizers is selected from the group consisting of optionally substituted fullerenes, optionally substituted phthalocyanines, optionally substituted perylenes, optionally substituted porphyrins, and optionally substituted terrylenes.

In some embodiments, the luminescent wavelength conversion material of the encapsulation structure comprises the sensitizer in an amount in the range of about 0.01% to about 5%, by weight based on the total weight of the composition.

In some embodiments, the luminescent wavelength conversion material of the encapsulation structure further comprises one or multiple plasticizers. In some embodiments, the plasticizer is selected from N-alkyl carbazole derivatives and triphenylamine derivatives.

In some embodiments, the composition of the luminescent wavelength conversion material further comprises a UV stabilizer, antioxidant, or absorber. In some embodiments, the composition of the pure polymer encapsulate further comprises a UV stabilizer, antioxidant, or absorber.

In some embodiments, the glass or plastic sheets used as an environmental cover may also further comprise a strong UV absorber to block harmful high energy radiation. In some embodiments, additional materials or layers may be used in the structure such as glass sheets, reflective backsheets, edge sealing tape, frame materials, polymer materials, or adhesive layers to adhere additional layers to the system.

Another aspect of the invention is a method of improving the performance of a solar cell, a solar string, a solar panel, or photovoltaic device, comprising encapsulating the device with the encapsulation structure disclosed herein.

In some embodiments, of the method, the solar panel contains at least one photovoltaic device or solar cell comprising a Cadmium Sulfide/Cadmium Telluride solar cell. In some embodiments, the photovoltaic device or solar cell comprises a Copper Indium Gallium Diselenide solar cell. In some embodiments, the photovoltaic or solar cell comprises a III-V or II-VI PN junction device. In some embodiments, the photovoltaic or solar cell comprises an organic sensitizer device. In some embodiments, the photovoltaic or solar cell comprises an organic thin film device. In some embodiments, the photovoltaic device or solar cell comprises an amorphous Silicon (a-Si) solar cell. In some embodiments, the photovoltaic device or solar cell comprises a microcrystalline Silicon (μc-Si) solar cell. In some embodiments, the photovoltaic device or solar cell comprises a crystalline Silicon (c-Si) solar cell.

In some embodiments, of the method, additional material layers may also be used in the encapsulation structure. For example, glass or plastic sheets may be used to provide additional environmental protection. Back sheets may be used to provide reflection and/or refraction of photons not absorbed by the solar cells. Adhesive layers may also be needed. For instance, an adhesive layer in between the luminescent wavelength conversion material and the glass sheets which is used to adhere these two layers together. Other layers may also be included to further enhance the photoelectric conversion efficiency of solar modules. For example, a microstructured layer may also be provided on top of the encapsulation structure or in between the luminescent wavelength conversion material and a glass sheet, which is designed to further enhance the solar harvesting efficiency of solar modules by decreasing the loss of photons to the environment which are often re-emitted from the chromophore after absorption and wavelength conversion in a direction that is away from the photoelectric conversion layer of the solar module device. A layer with various microstructures on the surface (i.e. pyramids or cones) may increase internal reflection and refraction of the photons into the photoelectric conversion layer of the solar cell device, further enhancing the solar harvesting efficiency of the device.

Solar harvesting devices may also be rigid or flexible. Rigid devices include Silicon based solar cells. Flexible solar devices are often made out of organic thin films and may be used on clothing, tents, or other flexible substrates. Therefore, in some embodiments, the encapsulation structure can be applied to rigid devices or flexible devices.

Figure 1:
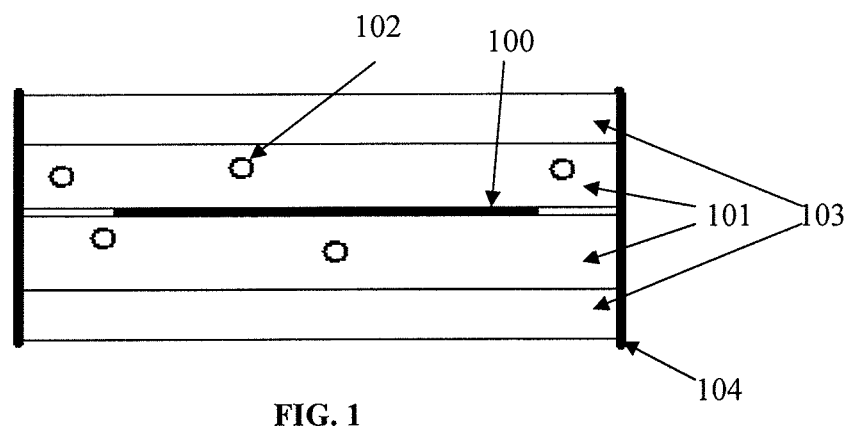
FIG. 1 illustrates an embodiment of an encapsulation structure where a single solar cell device is encapsulated in the luminescent wavelength conversion material and glass or plastic sheets are used as an environmental protective cover.

An embodiment of an encapsulation structure is illustrated in FIG. 1, comprising a single solar cell device 100 encapsulated by laminating the cell on both sides with films of the luminescent wavelength conversion material 101, which comprises an optically transparent polymer matrix and at least one chromophore 102. Glass or plastic films can be used as the environmental protective cover 103, and the sides are taped with sealing tape 104 to prevent ingress of oxygen and moisture.

Figure 2:
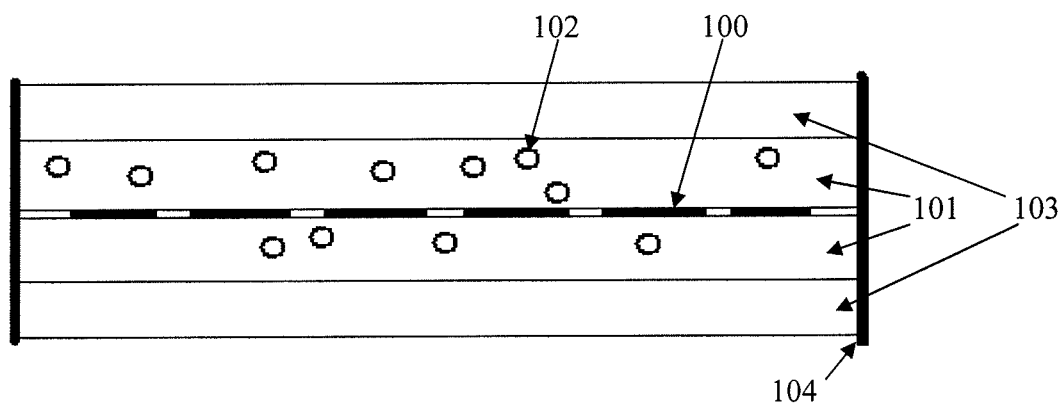
FIG. 2 illustrates an embodiment of an encapsulation structure where a plurality of solar cell devices are encapsulated in the luminescent wavelength conversion material and glass or plastic sheets are used as an environmental protective cover.

Another embodiment of an encapsulation structure is illustrated in FIG. 2, which shows a plurality of solar cell devices 100 encapsulated by laminating the cells on both sides with films of the luminescent wavelength conversion material 101, which comprises an optically transparent polymer matrix and at least one chromophore 102, and wherein, glass or plastic films are used as the environmental protective cover 103, and the sides are taped with sealing tape 104 to prevent ingress of oxygen and moisture.

Figure 3:
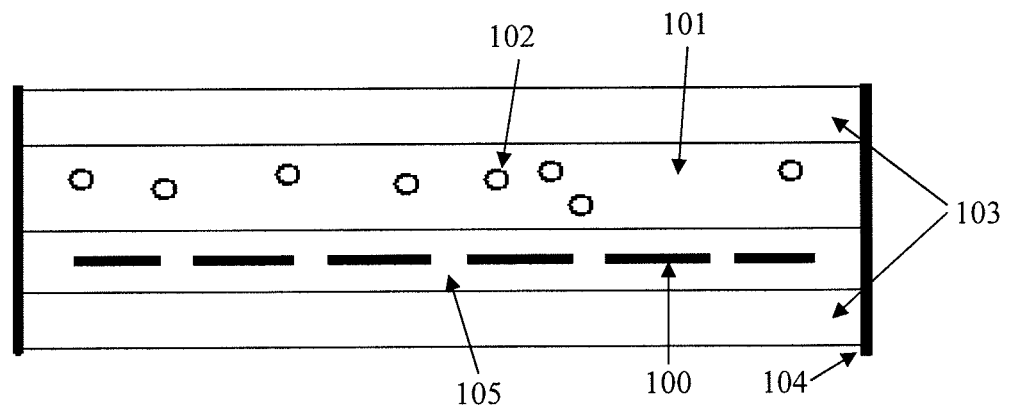
FIG. 3 illustrates an embodiment of an encapsulation structure where a plurality of solar cell devices are encapsulated in a pure polymer encapsulate, the luminescent wavelength conversion material is laminated on top of the polymer encapsulate, and glass or plastic sheets are used as an environmental protective cover.

Another embodiment of an encapsulation structure is illustrated in FIG. 3, which shows a plurality of solar cell devices 100 encapsulated by laminating the cell on both sides with a pure polymer encapsulate 105, then laminating the luminescent wavelength conversion material 101 on top of the pure polymer encapsulate. The luminescent wavelength conversion material 101 comprises an optically transparent polymer matrix and at least one chromophore 102, and wherein, glass or plastic films are used as the environmental protective cover 103, and the sides are taped with sealing tape 104 to prevent ingress of oxygen and moisture.

Figure 4:
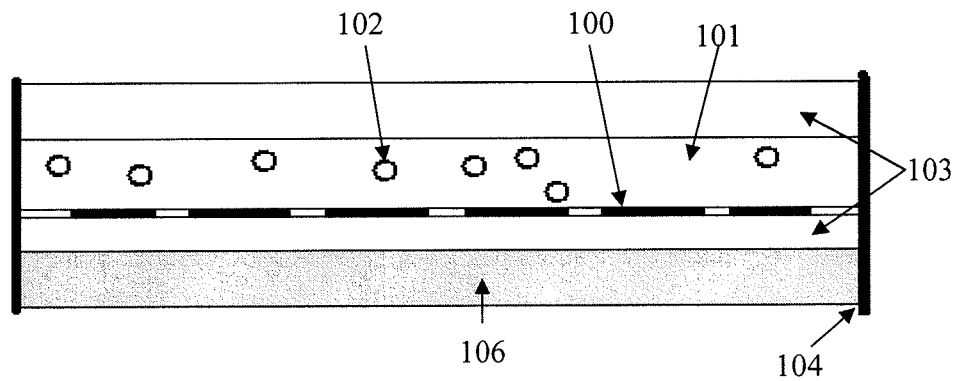
FIG. 4 illustrates an embodiment of an encapsulation structure where a plurality of solar cell devices are encapsulated in the luminescent wavelength conversion material and glass or plastic sheets are used as an environmental protective cover.

Another embodiment of an encapsulation structure is illustrated in FIG. 4, which shows a plurality of solar cell devices 100 encapsulated by laminating the cell on the light incident surface with a film of the luminescent wavelength conversion material 101, which comprises an optically transparent polymer matrix and at least one chromophore 102. A back sheet 106 is used underneath the solar cells, glass or plastic films are used as the environmental protective cover 103, and the sides are taped with sealing tape 104 to prevent ingress of oxygen and moisture.

Figure 5:
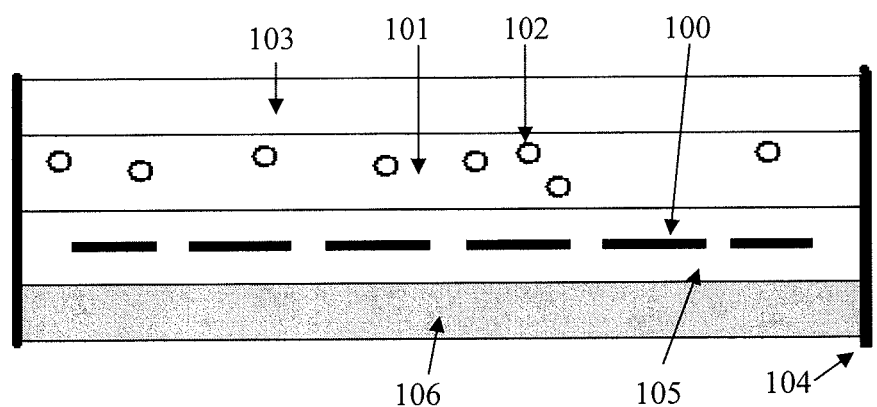
FIG. 5 illustrates an embodiment of an encapsulation structure where a plurality of solar cell devices are encapsulated in a pure polymer encapsulate, the luminescent wavelength conversion material is laminated on top of the polymer encapsulate, and glass or plastic sheets are used as an environmental protective cover.

Another embodiment of an encapsulation structure is illustrated in FIG. 5, which shows a plurality of solar cell devices 100 encapsulated by laminating the cell on both sides with a pure polymer encapsulate 105, then laminating the luminescent wavelength conversion material 101 on top of the pure polymer encapsulate. The luminescent wavelength conversion material comprises an optically transparent polymer matrix and at least one chromophore 102. A back sheet 106 is used underneath the solar cells, glass or plastic films are used as the environmental protective cover 103, and the sides are taped with sealing tape 104 to prevent ingress of oxygen and moisture.

Figure 6:
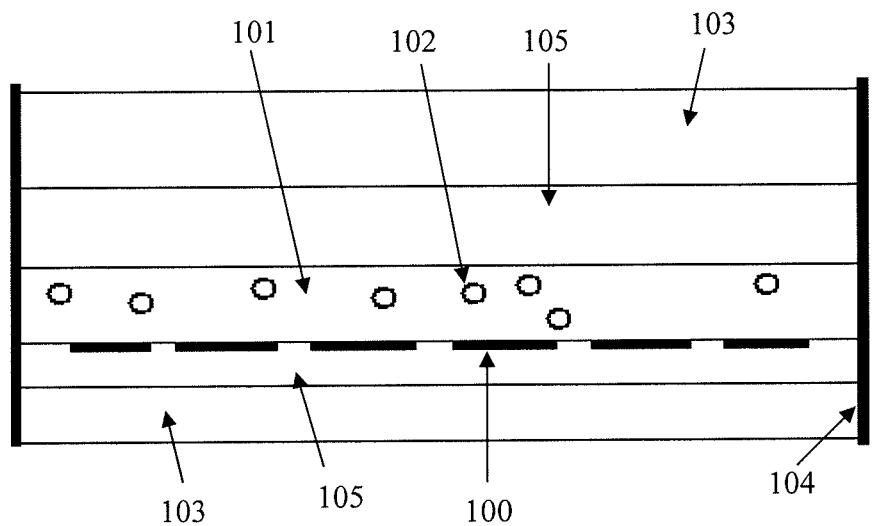
FIG. 6 illustrates an embodiment of an encapsulation structure where a plurality of solar cell devices are encapsulated in a pure polymer encapsulation material, the luminescent wavelength conversion material is laminated on top of the pure polymer encapsulate, an additional pure polymer film is laminated on top of the luminescent wavelength conversion layer, and glass or plastic sheets are used as environmental protector.

Another embodiment of an encapsulation structure is illustrated in FIG. 6, which shows a plurality of solar cell devices 100 encapsulated by laminating the cell on one side with a pure polymer encapsulate 105, then laminating the luminescent wavelength conversion material 101 on top of the pure polymer encapsulate. The luminescent wavelength conversion material 101 comprises an optically transparent polymer matrix and at least one chromophore 102. An additional pure polymer encapsulate layer 105, which may contain a UV absorber to block harmful high energy irradiation, is laminated on top of the luminescent wavelength conversion material, and glass or plastic films are used as the environmental protective cover 103, and the sides are taped with sealing tape 104 to prevent ingress of oxygen and moisture.

Another embodiment of an encapsulation structure is illustrated in FIG. 7, which shows a single solar cell device 100 encapsulated in the luminescent wavelength conversion material 101, which comprises an optically transparent polymer matrix and at least one chromophore 102, and wherein the luminescent wavelength conversion material also acts as an environmental protective against oxygen and moisture penetration to the cell.

Another embodiment of an encapsulation structure is illustrated in FIG. 8, which shows a plurality of solar cell devices 100 encapsulated in the luminescent wavelength conversion material 101, which comprises an optically transparent polymer matrix and at least one chromophore 102, and wherein the luminescent wavelength conversion material also acts as an environmental protective against oxygen and moisture penetration to the cell.

Another embodiment of an encapsulation structure is illustrated in FIG. 9, which shows a plurality of solar cell devices 100 encapsulated by laminating the cell on the light incident side with a pure polymer encapsulate 105, then laminating the luminescent wavelength conversion material 101 on top of the pure polymer encapsulate. The luminescent wavelength conversion material 101 comprises an optically transparent polymer matrix and at least one chromophore 102, and wherein the luminescent wavelength conversion material also acts as an environmental protective against oxygen and moisture penetration to the cell. Glass or plastic films are used as the bottom environmental protective cover 103, and the sides are taped with sealing tape 104 to prevent ingress of oxygen and moisture.

Another embodiment of an encapsulation structure is illustrated in FIG. 10, which shows a solar panel constructed with several solar cell devices 100, a luminescent wavelength conversion material 101 encapsulating the solar cell devices, a glass bottom sheet 103 and a glass top sheet 103 are used as the environmental protective covers 103, a back sheet 106 is underneath the bottom glass sheet and a frame 107 holds the module together.

Another embodiment of an encapsulation structure is illustrated in FIG. 11, which shows a solar panel constructed with several solar cell devices 100, a luminescent wavelength conversion material 101 encapsulating the solar cell devices, a back sheet 106 is underneath the light incident surface of the solar cell devices, a glass top sheet 103 is adhered to the top of the module, and a frame 107 holds the module together.

In some embodiments, the luminescent wavelength conversion material comprising at least one chromophore and an optically transparent polymer matrix, is applied to solar cell devices by first synthesizing the dye/polymer solution in the form of a liquid or gel, applying the dye/polymer solution to a solar cell matrix arranged on a removable substrate using standard methods of application, such as spin coating or drop casting, then curing the dye/polymer solution to a solid form (i.e. heat treating, UV exposure, etc.) as is determined by the formulation design.

In another embodiment, the luminescent wavelength conversion material comprising at least one chromophore and an optically transparent polymer matrix, is applied to solar cell devices by first synthesizing a dye/polymer thin film, and then adhering the dye/polymer thin film to the solar cell devices using an optically transparent and photostable adhesive and/or laminator. The dye/polymer thin film can be applied first on top of and then on bottom of the solar cells, to completely encapsulate the cells. The dye/polymer thin film can also be applied to just the top surface, wherein the bottom surface of the solar cells are secured to a substrate, such as a back sheet, and the dye/polymer thin film is applied to the top surface of the solar cells and the portion of the substrate that does not have solar cells attached to it.

Synthetic methods for forming the encapsulation structure are not restricted. Synthetic methods for the luminescent wavelength conversion material are not restricted, but may follow the example synthetic procedures described as Scheme 1 and Scheme 2 detailed below.

Scheme 1: Wet Processing General Procedure for forming the WLC Material

In some embodiments, a luminescent wavelength conversion material 101, which comprises at least one chromophore 102, and an optically transparent polymer matrix, is fabricated into a film structure. The wavelength conversion layer is fabricated by (i) preparing a polymer solution with dissolved polymer powder in a solvent such as tetrachloroethylene (TCE), cyclopentanone, dioxane, etc., at a predetermined ratio; (ii) preparing a chromophore solution containing a polymer mixture by mixing the polymer solution with the chromophore at a predetermined weight ratio to obtain a dye-containing polymer solution, (iii) forming the dye/polymer film by directly casting the dye-containing polymer solution onto a glass substrate, then heat treating the substrate from room temperature up to 100° C. in 2 hours, completely removing the remaining solvent by further vacuum heating at 130° C. overnight, and (iv) peeling off the dye/polymer film under the water and then drying out the free-standing polymer film before use; (v) the film thickness can be controlled from 0.1 µm~1 mm by varying the dye/polymer solution concentration and evaporation speed.

Scheme 2: Dry Processing General Procedure for Forming the WLC Material

In some embodiments, a luminescent wavelength conversion material 101, which comprises at least one chromophore 102, and an optically transparent polymer matrix, is fabricated into a film structure. The wavelength conversion layer is fabricated by (i) mixing polymer powders or pellets and chromophore powders together at a predetermined ratio by a mixer at a certain temperature; (ii) degassing the mixture between 1-8 hours at a certain temperature; (iii) then forming the layer using an extruder; (v) the extruder controls the layer thickness from 1 µm~1 mm.

Once the luminescent wavelength conversion encapsulation film is formed it can be adhered to the solar module devices using an optically transparent and photostable adhesive.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed examples which follow.

EXAMPLES

The following embodiments are not intended to limit the present invention. In the present disclosure, the listed substituent groups include both further substituted and unsubstituted groups unless specified otherwise. Further, in the present disclosure where conditions and/or structures are not specified, the skilled artisan in the art can readily provide such conditions and/or structures, in light of the teachings herein.

Synthesis of Chromophores

Compounds 1 and 2

Synthesis of the chromophores was performed according to the following scheme:

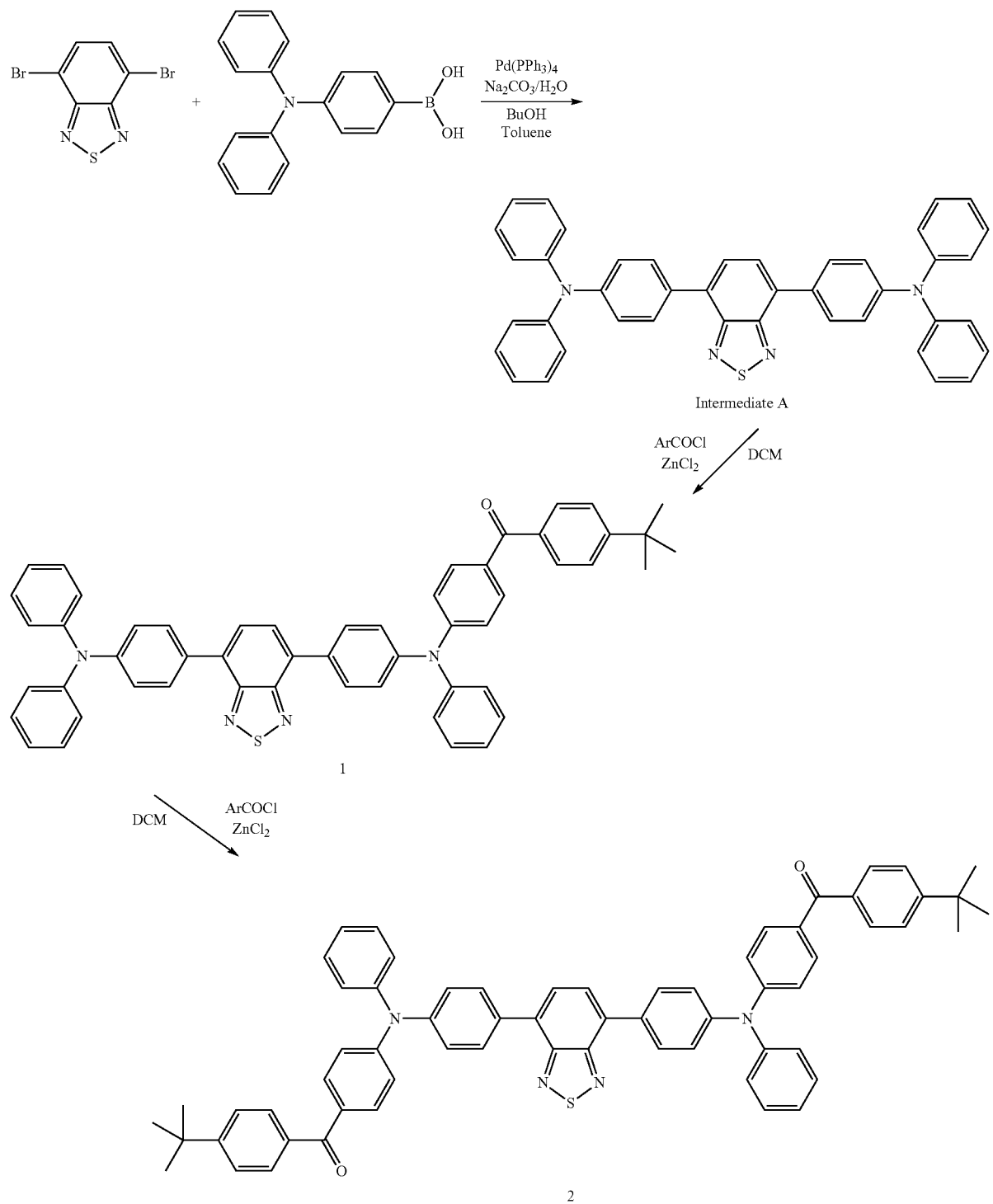

A mixture of 4,7-dibromobenzo[2,1,3]thiadiazole (13.2 g, 45 mmol), 4-(N,N-diphenylamino)phenylboronic acid (30.0 g, 104 mmol), a solution of sodium carbonate (21.2 g, 200 mmol) in water (80 mL), tetrakis(triphenylphosphine)palladium(0) (5.0 g, 4.3 mmol), n-butanol (800 mL), and toluene (400 mL) was stirred under argon and heated at 100° C. for 20 hours. After cooling to room temperature, the mixture was diluted with water (600 mL) and stirred for 2 hours. Finally, the reaction mixture was extracted with toluene (2 L), and the volatiles were removed under reduced pressure. The residue was chromatographed using silica gel and hexane/dichloromethane (1:1) as an eluent to give 26.96 g (43.3 mmol, 96%) of 4,7-bis[(N,N-diphenylamino)phenyl)]benzo[2,1,3]thiadiazole (Intermediate A).

To a solution of Intermediate A (22.0 g, 35.3 mmol) in dichloromethane (800 mL) stirred under argon and cooled in an ice/water bath were added in small portions 4-t-butylbenzoyl chloride (97.4 mL, 500 mmol) and 1M solution of zinc chloride in ethyl ether (700 mL, 700 mmol). The obtained mixture was stirred and heated at 44° C. for 68 hours. The reaction mixture was poured onto crushed ice (2 kg), stirred, treated with saturated sodium carbonate to pH 8, diluted with dichloromethane (2 L) and filtered through a fit-glass funnel under atmospheric pressure. The dichloromethane layer was separated, dried over magnesium sulfate, and the solvent was evaporated. Column chromatography of the residue (silica gel, hexane/dichloromethane/ethyl acetate, 48:50:2) followed by recrystallization from ethanol gave pure luminescent dye Compound 1 as the first fraction, 7.72 g (28%). $^1$H NMR (400 MHz, CDCl$_3$): δ 7.94 (d, 2H, J=7.3 Hz), 7.87 (d, 2H, J=7.7 Hz), 7.74 (m, 6H), 7.47 (d, 2H, J=7.3 Hz), 7.36 (t, 2H, J=7.3 Hz), 7.31 (d, 2H, J=7.3 Hz), 7.27 (m, 6H), 7.19 (m, 7H), 7.13 (d, 2H, J=7.7 Hz), 7.06 (t, 2H, J=7.3 Hz), 1.35 (s, 9H). UV-vis spectrum: $\lambda_{max}$=448 nm (dichloromethane), 456 nm (PVB film). Fluorimetry: $\lambda_{max}$=618 nm (dichloromethane), 562 nm (PVB film).

The second fraction gave chromophore Compound 2, 12.35 g (37% yield). $^1$H NMR (400 MHz, CDCl$_3$): δ 7.95 (d, 4H, J=8.4 Hz), 7.79-7.73 (m, 10H), 7.48 (d, 4H, J=7.7 Hz), 7.36 (t, 4H, J=7.7 Hz), 7.31 (d, 4H, J=8.4 Hz), 7.25 (d, 4H, J=7.7 Hz), 7.18 (t, J=7.3, 2H, Ph), 7.14 (d, 4H, J=8.8 Hz), 1.35 (s, 18H). UV-vis spectrum: $\lambda_{max}$=437 nm (dichloromethane), 455 nm (PVB film). Fluorimetry: $\lambda_{max}$=607 nm (dichloromethane), 547 nm (PVB film).

Intermediate B

Common Intermediate B is synthesized in a two step process.

Step 1: Synthesis of 2-(4-Nitrophenyl)-2H-benzo[d][1,2,3]triazole

A mixture of 4-chloronitrobenzene (55.0 g, 349 mmol), benzotriazole (50.0 g, 420 mmol), potassium carbonate (200 g, 500 mmol), and NMP (500 mL) was stirred and heated under argon at 130° C. for 5 hours. Progress of the reaction was monitored by thin layer chromatography. The reaction mixture was poured onto crushed ice (2 kg). After all ice melted, the solid was filtered off and washed with water (200 mL). The product was suspended in methanol (1.5 L) and stirred for 30 minutes. The crystals were filtered off and dried in a vacuum oven. Column chromatography of the obtained material using silica gel and hot solution of ethyl acetate (1%) in toluene as an eluent gave 2-(4-nitrophenyl)-2H benzo[d][1,2,3]triazole (24.24 g, 30% yield). $^1$H NMR (400 MHz, CDCl$_3$): δ 8.57 (d, J=9.2 Hz, 2H, 4-nitrophenyl), 8.44 (d, J=9.2 Hz, 2H, 4-nitrophenyl), 7.93 (m, 2H, benzotriazole), 7.47 (m, 2H, benzotriazole).

Step 2: Synthesis of 4,7-Dibromo-2-(4-nitrophenyl)-2H-benzo[d][1,2,3]triazole (Intermediate B)

A mixture of 2-(4-nitrophenyl)-2H-benzo[d][1,2,3]triazole (7.70 g, 31.2 mmol), bromine (4.8 mL, 94 mmol) and 48% HBr (120 mL) was heated at 130° C. for 20 hours under a reflux condenser connected with an HBr trap. The reaction mixture was poured onto crushed ice (800 g), decolorized with 5% solution of Na2SO3, and set aside at room temperature for 2 hours. The precipitate was filtered off, washed with water (200 mL) followed by 2% NaHCO3 (200 mL) and again water (200 mL) The material was dried in a vacuum oven to give 4,7-dibromo-2-(4-nitrophenyl)-2H-benzo[d][1,2,3]triazole (Intermediate B, 13.47 g) of purity 90%. Yield 97%. $^1$H NMR (400 MHz, CDCl$_3$): □ 8.65 (m, 2H, 4-nitrophenyl), 8.44 (m, 2H, 4-nitrophenyl), 7.54 (s, 2H, benzotriazole).

Intermediate C

Intermediate C was synthesized using the following reaction scheme.

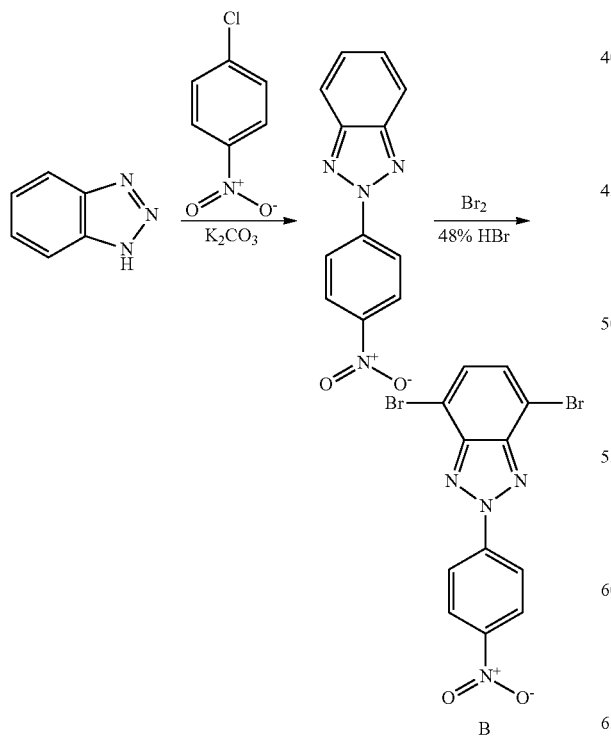

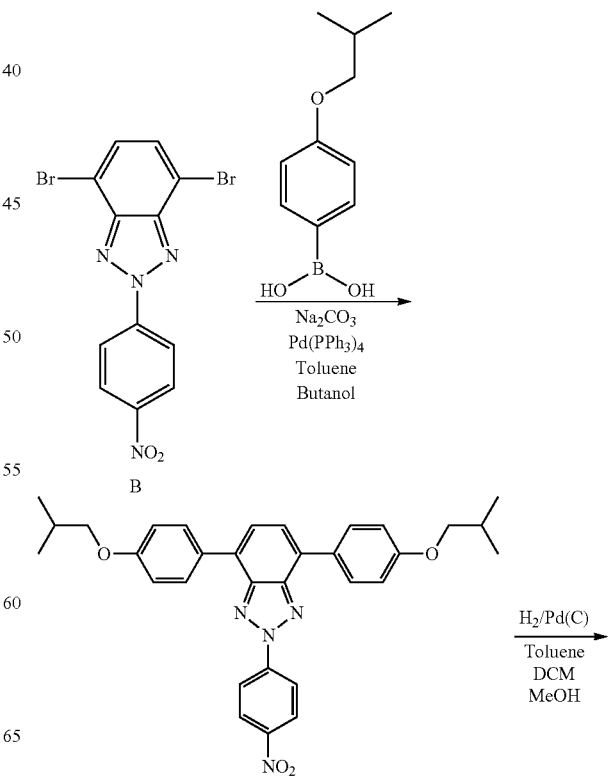

-continued

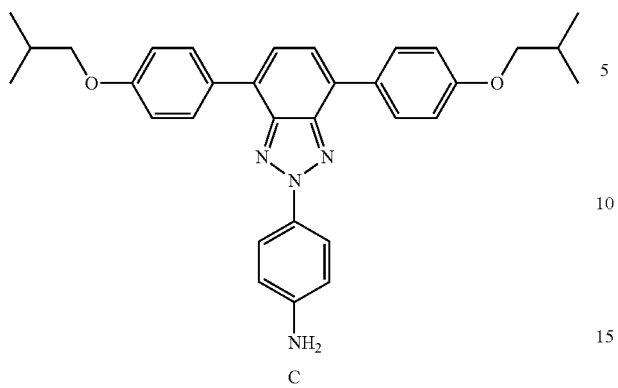

C

A mixture of Intermediate B (3.98 g, 10.0 mmol), 4-isobutoxyphenylboronic acid (5.00 g, 25.7 mmol), sodium carbonate (5.30 g, 50 mmol) in water (40 mL), tetrakis(triphenylphosphine)palladium(0) (2.00 g), n-butanol (60 mL), and toluene (30 mL) was stirred under argon and heated at 100° C. for 4 hours. The reaction mixture was poured into water (200 mL), stirred for 30 minutes and extracted with toluene (500 mL) The extract was washed with water (200 mL), concentrated to a volume of 100 mL and diluted with dichloromethane (200 mL) and methanol (200 mL). The obtained solution was hydrogenated for 20 minutes at 50 psi over 10% Pd/C (2 g), filtered through a layer of Celite, and the solvent was removed under reduced pressure. The residue was chromatographed (silica gel, hexane/dichloromethane/ethyl acetate, 35:50:5) to give 4,7-Bis(4-isobutoxyphenyl)-2-(4-aminophenyl)-2H-benzo[d][1,2,3]triazole (Intermediate C) (3.80 g, 75%). $^1$H NMR (400 MHz, CDCl$_3$): δ 8.22 (d, J=8.4 Hz, 2H, 4-aminophenyl), 8.09 (d, J=8.7 Hz, 4H, 4-i-BuOC$_6$H$_4$), 7.57 (s, 2H, benzotriazole), 7.06 (d, J=8.7 Hz, 4H, 4-i-BuOC$_6$H$_4$), 6.79 (d, J=8.5 Hz, 2H, 4-aminophenyl), 3.90 (bs, 2H, NH$_2$), 3.81 (d, J=6.6 Hz, 4H, i-BuO), 2.14 (m, 2H, i-BuO), 1.06 (d, J=7.0 Hz, 12H, i-BuO).

Compound 3

Compound 3 was synthesized according to the following reaction scheme.

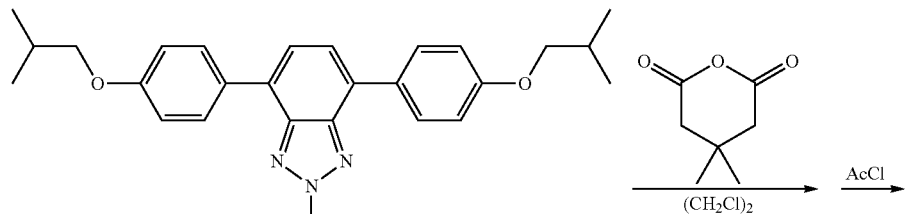

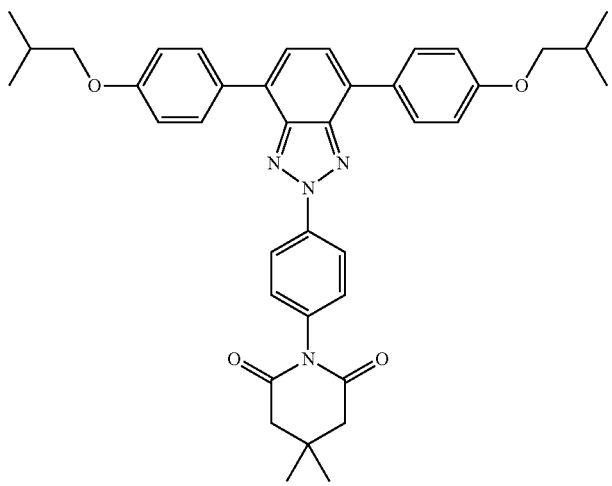

3

A solution of Intermediate C (0.92 g, 1.82 mmol), 3,3-dimethylglutaric anhydride (284 mg, 2.0 mmol) in 1,2-dichloroethane (20 mL) was heated under a reflux condenser at 80° C. for 20 hours. After cooling to room temperature, acetyl chloride (0.28 mL, 4.0 mmol) was added, and the mixture was heated at 80° C. for 1 hour. The reaction mixture was diluted with dichloromethane (200 mL) and washed with saturated NaHCO3 (100 mL) The solution was dried over MgSO4, and the volatiles were removed under reduced pressure. The crude product was purified by column chromatography (silica gel, hexane/dichloromethane/ethyl acetate, 37:60:3) and crystallization from ethanol to give 1-(4-(4,7-bis(4-isobutoxyphenyl)-2H-benzo[d][1,2,3]triazol-2-yl)phenyl)-4,4-dimethylpiperidine-2,6-dione (Compound 3, 551 mg, 48% yield) as thin yellow needles. $^1$H NMR (400 MHz, CDCl$_3$): δ 8.53 (d, J=8.8 Hz, 2H, 4-imidophenyl), 8.08 (d, J=8.8 Hz, 4H, 4-i-BuOC$_6$H$_4$), 7.61 (s, 2H, benzotriazole), 7.26 (d, J=8.8 Hz, 2H, 4-imidophenyl), 7.07 (d, J=8.8 Hz, 4H, 4-i-BuOC$_6$H$_4$), 3.82 (d, J=6.6 Hz, 4H, i-BuO), 2.72 (s, 4H, 4,4-dimethylpiperidine-2,6-dione), 2.14 (m, 2H, i-BuO), 1.24 (s, 6H, 4,4-dimethylpiperidine-2,6-dione), 1.06 (d, J=7.0 Hz, 12H, i-BuO). UV-vis spectrum (PVB): $\lambda_{max}$=388 nm Fluorimetry (PVB): $\lambda_{max}$=478 nm.

Example 1

A wavelength conversion layer is fabricated by (i) preparing a 20 wt % polyvinyl butyral (PVB) (Aldrich and used as received) polymer solution with dissolved polymer powder in cyclopentanone; (ii) preparing a chromophore containing a PVB matrix by mixing the PVB polymer solution with the synthesized Compound 1 at a weight ratio (Compound 1/PVB) of 0.3 wt % to obtain a chromophore-containing polymer solution; (iii) forming the dye/polymer film by directly casting the dye-containing polymer solution onto a glass substrate, then heat treating the substrate from room temperature up to 100° C. in 2 hours, completely removing the remaining solvent by further vacuum heating at 130° C. overnight, and (iv) peeling off the dye/polymer film under the water and then drying out the free-standing polymer film before use. After the film is dried out, it is hot pressed into a luminescent wavelength conversion sheet of ~500 μM thickness.

Then, in some embodiments, the luminescent wavelength conversion sheet, a commercial 5 inch monocrystalline silicon solar cell, and a pure PVB polymer encapsulate are laminated onto an ~3 mm thick glass sheet in vacuum at 130° C. with the luminescent wavelength conversion sheet as the front surface, similar to the structure shown in FIG. 8. The output of the solar cell is measured before and after lamination and a relative improvement of ~12.5% is achieved.

Example 2

Example 2 is synthesized using the same method as given in Example 1, except that Compound 2 is used instead of Compound 1, and a pure ethylene vinyl acetate (EVA) polymer encapsulate is used instead of the pure PVB polymer encapsulate. The output of the solar cell is measured before and after lamination and a relative improvement of ~8.9% is observed.

Example 3

Example 3 is synthesized similar to Example 2, except that the structure is laminated between two ~3 mm thick glass sheets, similar to the structure shown in FIG. 3, where the sequence of layers is as follows: top glass sheet, luminescent wavelength conversion sheet, solar cell encapsulated in pure EVA polymer, and bottom glass sheet. The output of the solar cell is measured before and after lamination and a relative improvement of ~7.5% is observed.

Example 4

Example 4 is synthesized similar to Example 2, except that the structure is laminated between a ~3 mm thick glass sheet and a back sheet (254 μm thick Madico Protekt® TFB PV Backsheet manufactured by Madico, Inc.), similar to the structure shown in FIG. 5, where the sequence of layers is as follows: top glass sheet, luminescent wavelength conversion sheet, solar cell encapsulated in pure EVA polymer, and a back sheet. The output of the solar cell is measured before and after lamination and a relative improvement of ~7.8% is observed.

Example 5

Example 5 is synthesized similar to Example 3, except that Compound 3 is used in the wavelength conversion layer at a weight ratio (Compound 3/EVA) of 0.1%, and a 1 inch by 1 inch crystalline silicon solar cell is used instead of a 5 inch×5 inch monocrystalline silicon solar cell. The structure is laminated between two ~3 mm thick glass sheets, similar to the structure shown in FIG. 3, where the sequence of layers is as follows: top glass sheet, luminescent wavelength conversion sheet, solar cell encapsulated in pure EVA polymer, and bottom glass sheet. The output of the solar cell is measured before and after lamination and a relative improvement of ~2.6% is observed.

Example 6

Example 6 is synthesized similar to Example 5, except that Compound 3 is used in the wavelength conversion layer at a weight ratio (Compound 3/EVA) of 0.2%. The output of the solar cell is measured before and after lamination and a relative improvement of ~2.8% is observed.

Example 7

Example 7 is synthesized similar to Example 5, except that Compound 3 is used in the wavelength conversion layer at a weight ratio (Compound 3/EVA) of 0.3%. The output of the solar cell is measured before and after lamination and a relative improvement of ~1.6% is observed.

Comparative Example 8

Example 8 is synthesized similar to Example 5, except that no luminescent compound is used, where the sequence of layers is as follows: top glass sheet, pure EVA sheet, solar cell encapsulated in pure EVA polymer, and bottom glass sheet. The output of the solar cell is measured before and after lamination and a relative improvement of ~0.7% is observed.

The object of this current invention is to provide an encapsulation structure comprising a luminescent wavelength conversion material which may be suitable for encapsulating solar cells, photovoltaic devices, solar modules, and solar panels. As illustrated by the above examples, the use of this material improves the solar cell light conversion efficiency.

For purposes of summarizing aspects of the invention and the advantages achieved over the related art, certain objects and advantages of the invention are described in this disclosure.

Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein. It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. An encapsulation structure for a solar energy conversion device comprising:
a luminescent wavelength conversion material comprising at least one chromophore and an optically transparent polymer matrix;
wherein the at least one chromophore is represented by formula (I-a)

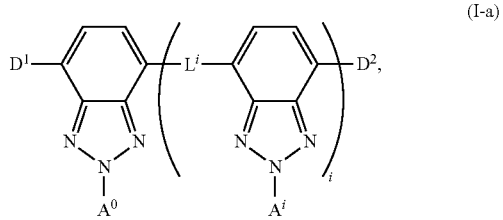

i is an integer in the range of 0 to 100;
$A^0$ and $A^i$ are each independently selected from the group consisting of optionally substituted alkyl, optionally substituted alkenyl, optionally substituted heteroalkyl, optionally substituted heteroaryl, optionally substituted amino, optionally substituted amido, optionally substituted cyclic amido, optionally substituted cyclic imido, optionally substituted alkoxy, optionally substituted carboxy, and optionally substituted carbonyl;
$D^1$ and $D^2$ are each independently selected from the group consisting of hydrogen, optionally substituted alkoxy, optionally substituted aryloxy, optionally substituted acyloxy, optionally substituted alkyl, optionally substituted aryl, optionally substituted heteroaryl, optionally substituted amino, amido, cyclic amido, and cyclic imido, provided that $D^1$ and $D^2$ are not both hydrogen;
$L^i$ is independently selected from the group consisting of optionally substituted alkylene, optionally substituted alkenylene, optionally substituted alkynylene, optionally substituted arylene, and optionally substituted heteroarylene; and
wherein the luminescent wavelength conversion material is configured to encapsulate the solar energy conversion device and inhibit penetration of moisture and oxygen into the solar energy conversion device.

2. An encapsulation structure for a solar energy conversion device comprising:
a luminescent wavelength conversion material comprising at least one chromophore and an optically transparent polymer matrix;
wherein the at least one chromophore is further represented by formula (II-a):

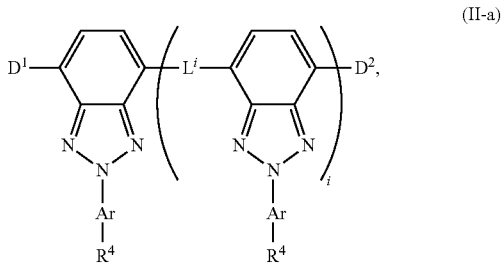

wherein:
i is an integer in the range of 0 to 100;
Ar is optionally substituted aryl or optionally substituted heteroaryl;
$R^4$ is

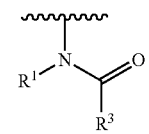

or optionally substituted cyclic imido;
$R^1$ is each independently selected from the group consisting of H, alkyl, alkenyl, aryl, heteroaryl, aralkyl, and alkaryl;
$R^3$ is each independently selected from the group consisting of optionally substituted alkyl, optionally substituted alkenyl, optionally substituted aryl, and optionally substituted heteroaryl; or $R^1$ and $R^3$ may be connected together to form a ring;
$D^1$ and $D^2$ are each independently selected from the group consisting of hydrogen, optionally substituted alkoxy, optionally substituted aryloxy, optionally substituted acyloxy, optionally substituted alkyl, optionally substituted aryl, optionally substituted heteroaryl, optionally substituted amino, amido, cyclic amido, and cyclic imido, provided that $D^1$ and $D^2$ are not both hydrogen; and
$L^i$ is independently selected from the group consisting of optionally substituted alkylene, optionally substituted alkenylene, optionally substituted alkynylene, optionally substituted arylene, and optionally substituted heteroarylene; wherein the luminescent wavelength conversion material is configured to encapsulate the solar energy conversion device and inhibit penetration of moisture and oxygen into the solar energy conversion device.

3. The encapsulation structure according to claim 1, wherein the at least one chromophore is further represented by formula (III-a):

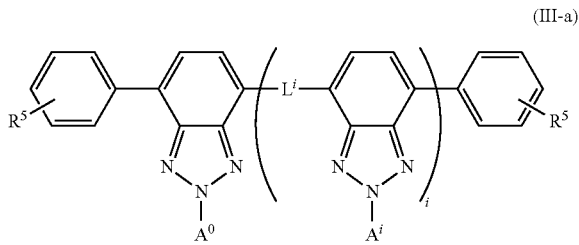

(III-a)

wherein:
i is an integer in the range of 0 to 100;
A⁰ and Aⁱ are each independently selected from the group consisting of optionally substituted alkyl, optionally substituted alkenyl, optionally substituted heteroalkyl, optionally substituted amido, optionally substituted alkoxy, optionally substituted carbonyl, and optionally substituted carboxy;
each R⁵ is independently selected from the group consisting of optionally substituted alkyl, optionally substituted alkoxy, optionally substituted aryloxy, optionally substituted acyloxy, and amino; and
Lⁱ is independently selected from the group consisting of optionally substituted alkylene, optionally substituted alkenylene, optionally substituted alkynylene, optionally substituted arylene, and optionally substituted heteroarylene.

4. The encapsulation structure according to claim 1, wherein the encapsulation structure comprises two or more chromophores.

5. The encapsulation structure according to claim 1, wherein the optically transparent polymer matrix comprises one or more polymers.

6. The encapsulation structure according to claim 5, wherein the polymer is selected from the group consisting of polyethylene terephthalate, polymethyl methacrylate, polyvinyl butyral, ethylene vinyl acetate, ethylene tetrafluoroethylene, polyimide, amorphous polycarbonate, polystyrene, siloxane sol-gel, polyurethane, polyacrylate, and combinations thereof.

7. The encapsulation structure according to claim 1, wherein the refractive index of the polymer matrix material is in the range of about 1.4 to about 1.7.

8. The encapsulation structure according to claim 1, wherein the chromophore is present in the polymer matrix in an amount in the range of about 0.01 wt % to about 3 wt %.

9. The encapsulation structure according to claim 1, wherein the luminescent wavelength conversion material further comprises one or more sensitizers.

10. The encapsulation structure according to claim 9, wherein the sensitizer is selected from the group consisting of optionally substituted fullerenes, optionally substituted phthalocyanine, optionally substituted perylene, optionally substituted porphyrin, and optionally substituted terrylene.

11. The encapsulation structure according to claim 9, wherein the sensitizer is present in an amount in the range of about 0.01% to about 5%, by weight based on the total weight of the luminescent wavelength conversion material.

12. The encapsulation structure according to claim 9, wherein the sensitizer comprises nanoparticles, nanometals, nanowires, or carbon nanotubes.

13. The encapsulation structure according to claim 12, wherein the nanoparticle comprises a fullerene.

14. The encapsulation structure according to claim 1, wherein the composition of the luminescent wavelength conversion material further comprises one or more plasticizers.

15. The encapsulation structure according to claim 14, wherein the plasticizer is selected from the group consisting of N-alkyl carbazole derivatives and triphenylamine derivatives.

16. The encapsulation structure according to claim 1, wherein the luminescent wavelength conversion material further comprises a UV stabilizer, antioxidant, and/or absorber.

17. The encapsulation structure according to claim 1, further comprising one or more of glass sheets, reflective backsheets, edge sealing tape, frame materials, polymer encapsulation materials, or adhesive layers to adhere additional layers to the system.

18. The encapsulation structure according to claim 1, further comprising an additional polymer layer containing a UV absorber.

19. An encapsulation structure for a solar energy conversion device comprising:
a luminescent wavelength conversion material comprising at least one chromophore and an optically transparent polymer matrix;
an environmental protective cover configured to inhibit penetration of moisture and oxygen into the luminescent wavelength conversion material and the solar energy conversion device;
wherein the at least one chromophore is represented by formula (I-a)

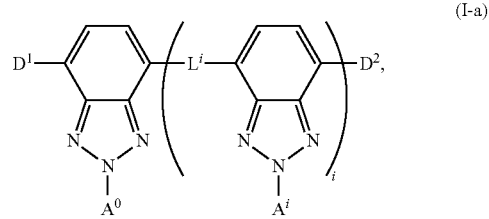

(I-a)

i is an integer in the range of 0 to 100;
A⁰ and Aⁱ are each independently selected from the group consisting of optionally substituted alkyl, optionally substituted alkenyl, optionally substituted heteroalkyl, optionally substituted heteroaryl, optionally substituted amino, optionally substituted amido, optionally substituted cyclic amido, optionally substituted cyclic imido, optionally substituted alkoxy, optionally substituted carboxy, and optionally substituted carbonyl;
D¹ and D² are each independently selected from the group consisting of hydrogen, optionally substituted alkoxy, optionally substituted aryloxy, optionally substituted acyloxy, optionally substituted alkyl, optionally substituted aryl, optionally substituted heteroaryl, optionally substituted amino, amido, cyclic amido, and cyclic imido, provided that D¹ and D² are not both hydrogen; and
Lⁱ is independently selected from the group consisting of optionally substituted alkylene, optionally substituted alkenylene, optionally substituted alkynylene, optionally substituted arylene, and optionally substituted heteroarylene; and
wherein the luminescent wavelength conversion material and the environmental protective cover together are configured to encapsulate the solar energy conversion device such that light must pass through the luminescent wavelength conversion material and the environmental protective cover prior to reaching the solar energy conversion device.

20. The encapsulation structure according to claim 19, wherein the environmental protective cover comprises glass or plastic layers.

21. The encapsulation structure according to claim 19, further comprising a sealing tape around the perimeter of the solar energy conversion device.

22. A method of improving the performance of a solar energy conversion device, comprising encapsulating the device with the encapsulation structure of claim 19.

23. The method according to claim 22, wherein the solar energy conversion device contains at least one device selected from the group consisting of a III-V or II-VI PN junction device, a Copper-Indium-Gallium-Selenium (CIGS) thin film device, an organic sensitizer device, an organic thin film device, a Cadmium Sulfide/Cadmium Telluride (CdS/CdTe) thin film device, an amorphous Silicon solar cell, a microcrystalline Silicon solar cell, and a crystalline Silicon solar cell.

24. The encapsulation structure according to claim 3, wherein $R^5$ in formula (III-a) is alkyl.

25. The encapsulation structure according to claim 1, wherein the luminescent wavelength conversion material encapsulates the solar energy conversion device.

26. The encapsulation structure according to claim 2, wherein the luminescent wavelength conversion material encapsulates the solar energy conversion device.

27. The encapsulation structure according to claim 3, wherein the luminescent wavelength conversion material encapsulates the solar energy conversion device.

* * * * *